US012628374B2

(12) United States Patent (10) Patent No.: US 12,628,374 B2
Abiko et al. (45) Date of Patent: May 12, 2026

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yuya Abiko, Tokyo (JP); Takahiro Maruyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 585 days.

(21) Appl. No.: 18/179,731

(22) Filed: Mar. 7, 2023

(65) Prior Publication Data

US 2023/0420556 A1 Dec. 28, 2023

(30) Foreign Application Priority Data

Jun. 22, 2022 (JP) ................................. 2022-100574

(51) Int. Cl.
H10D 30/66 (2025.01)
H10D 30/01 (2025.01)
H10D 64/00 (2025.01)
H10D 64/01 (2025.01)

(52) U.S. Cl.
CPC ....... H10D 30/668 (2025.01); H10D 30/0297 (2025.01); H10D 64/01 (2025.01); H10D 64/117 (2025.01)

(58) Field of Classification Search
CPC .. H10D 30/668; H10D 30/0297; H10D 64/01; H10D 64/117; H10D 64/2527; H10D 64/112; H10D 64/518; H10D 64/519; H10D 30/021; H10D 64/511; H10D 30/60; H01L 23/5226
See application file for complete search history.

(56) References Cited

U.S. PATENT DOCUMENTS

| 9,711,637 B2 | 7/2017 | Numabe et al. | |
| 11,594,629 B2 * | 2/2023 | Nagata ................. | H10D 62/113 |
| 12,302,602 B2 * | 5/2025 | Baba .................... | H10D 64/256 |

(Continued)

FOREIGN PATENT DOCUMENTS

| JP | 2018-082202 A | 5/2018 |
| JP | 2023-039219 A | 3/2023 |

OTHER PUBLICATIONS

Office Action dated Sep. 2, 2025, issued in corresponding JP Application No. 2022-100574, 8 pages.

*Primary Examiner* — Shahed Ahmed
*Assistant Examiner* — Khatib A Rahman
(74) *Attorney, Agent, or Firm* — Rimon P.C.

(57) ABSTRACT

An improved power MOSFET of a split gate structure including a gate electrode and a field plate electrode in a trench is disclosed. The improved power MOSFET includes a field plate electrode FP formed at a lower portion of a trench TR and a gate electrode GE formed an upper portion of the trench TR. The field plate electrode FP further includes a contact portion FPa which is formed at the upper portion of the trench TR to provide a source potential. The gate electrode GE further includes a connecting portion GEa at the both sides of the contact portion FPa in the trench TR. The connecting portion GEa electrically connects between one portion of the gate electrode GE at a region 2A side and the other portion of the gate electrode GE at a region 2A' side.

5 Claims, 21 Drawing Sheets

(56) References Cited

U.S. PATENT DOCUMENTS

| | | | |
|---|---|---|---|
| 2010/0140696 A1* | 6/2010 | Yedinak | H10D 30/668 |
| | | | 257/334 |
| 2019/0198660 A1* | 6/2019 | Kachi | H10D 62/106 |
| 2021/0249535 A1* | 8/2021 | Nagata | H10D 64/514 |
| 2021/0288176 A1* | 9/2021 | Tomita | H10D 30/668 |

* cited by examiner

B-B cross section

A-A cross section

*FIG. 5*

D-D cross section

C-C cross section

FIG. 6

B-B cross section

A-A cross section

B-B cross section

A-A cross section

*FIG. 10*

B-B cross section

A-A cross section

*FIG. 12*

B-B cross section

A-A cross section

FIG. 19

B-B cross section

A-A cross section

*FIG. 20*

B-B cross section

A-A cross section

SEMICONDUCTOR DEVICE AND METHOD OF MANUFACTURING THE SAME

CROSS-REFERENCE TO RELATED APPLICATIONS

The disclosure of Japanese Patent Application No. 2022-100574 filed on Jun. 22, 2022, including the specification, drawings and abstract is incorporated herein by reference in its entirety.

BACKGROUND OF THE INVENTION

The present invention relates to a semiconductor device and a method of manufacturing the same, and more particularly, relates to a semiconductor device including a gate electrode and a field plate electrode in a trench.

In a semiconductor device such as a power MOSFET (Metal Oxide Semiconductor Field Effect Transistor), a trench gate structure in which a gate electrode is embedded in a trench is applied. One type of the trench gate structure is a split gate structure in which a field plate electrode is formed at a lower portion of a trench and a gate electrode is formed at an upper portion of the trench. The field plate electrode is electrically connected to a source electrode. Accordingly, the breakdown voltage of the semiconductor device can be improved by widening a depletion layer from the field plate electrode at the time of turn-off.

For example, Japanese unexamined Patent Application publication JP-A-2018-82202 discloses a semiconductor device to which a double gate structure is applied. In JP-A-2018-82202, a source wiring is disposed in a central portion of the semiconductor device, a gate wiring is disposed in an outer periphery of the source wiring, and a wiring for a field plate electrode (control electrode wiring) is disposed in an outer periphery of the gate wiring. The control electrode wiring is physically and electrically separated from the source wiring and the gate wiring. Therefore, by connecting an external connection member such as wire bonding for supplying a desired potential to the control electrode wiring, not only the source potential but also the desired potential can be supplied to the control electrode wiring.

SUMMARY OF THE INVENTION

In the case where the control electrode is used as a field plate electrode fixed to the source potential, in JP-A-2018-82202, since the wiring for the field plate electrode is independent of the wiring for the source, it is necessary to connect separate external connection members to these wirings. Therefore, the layout of the semiconductor device becomes inefficient, and the manufacturing process and the manufacturing cost for connecting the external connection members are increased.

In view of them, it is efficient to make a connection to the field plate electrode below the source electrode. However, in this case, since it is necessary to expose the field plate electrode to the upper surface of the semiconductor substrate, a region in which the field plate electrode is formed is provided in the entire inside of the trench. Then, the gate electrode is divided by the region. Therefore, in the outer peripheral region of the semiconductor device, it is necessary to individually connect the gate wirings with the divided gate electrodes.

Here, the gate electrode and the gate wiring are connected through holes formed in the interlayer insulating film, but there is a possibility that the holes do not reach the gate electrode completely due to, for example, a case where the etching amount at the time of forming the holes is insufficient. Even if a hole to one of the divided gate electrodes is normally formed, if the hole to the other of the divided gate electrodes is not opened, MOSFET using the other gate electrode will not function.

A main purpose of the present invention is to provide a technique capable of causing a MOSFET using the gate electrode to function normally even if a hole to the other of the divided gate electrodes is not opened, thereby to improve the reliability of the semiconductor device.

Other objects and novel features will become apparent from the description of this specification and the attached drawings.

The typical ones of embodiments disclosed in the present application will be briefly described as follows.

A semiconductor device according to one embodiment comprising:

a semiconductor substrate of a first conductivity type having an upper surface and a lower surface;

a trench formed in the semiconductor substrate so as to reach a predetermined depth from the upper surface of the semiconductor substrate and extending to a first direction in a plan view;

a field plate electrode formed at a lower portion inside the trench;

a gate electrode formed in an upper portion inside the trench and being electrically isolated from the field plate electrode inside the trench;

an interlayer insulating film formed on the upper surface of the semiconductor substrate;

a source electrode formed on the interlayer insulating film so as to cover the trench;

a gate wiring formed on the interlayer insulating film so as to surround the source electrode in a plan view; and a first hole, a second hole and a third hole each formed in the interlayer insulating film, wherein the gate electrode includes a first end portion and a second end portion located on an opposite side of the first end portion in the first direction in a plane view, wherein the field plate electrode further includes a contact portion at the upper portion inside the trench which is located between the first end portion and the second end portion of the gate electrode in a plan view, wherein the first hole is formed so as to overlap the first end portion of the gate electrode in a plan view, wherein the second hole is formed so as to overlap the second end portion of the gate electrode in a plan view, wherein the third hole is formed so as to overlap the contact portion of the field plate electrode in a plan view, wherein the gate wiring is embedded in the first hole and the second hole and is electrically connected to the gate electrode, wherein the source electrode is embedded in the third hole and electrically connected to the field plate electrode, and wherein the gate electrode further includes a connecting portion electrically connecting the first end portion and the second end portion in the trench in which the contact portion of the field plate electrode is formed.

A method of manufacturing a semiconductor device according to one embodiment of the present invention comprising the steps of:

(a) preparing a semiconductor substrate of a first conductivity type having an upper surface and a lower surface;

(b) after the step(a), forming a trench in the semiconductor substrate so as to reach a predetermined depth from the upper surface of the semiconductor substrate and extend in the first direction in a plan view;

(c) after the step (b), forming a first insulating film inside the trench;

(d) after the step (c), forming a field plate electrode so as to fill the inside of the trench via the first insulating film;

(e) after the step (d), selectively retracting the field plate electrode such that a portion of the field plate electrode remains as a connecting portion;

(f) after the step (e), retracting the first insulating film such that a position of an upper surface of the first insulating film is lower than a position of an upper surface of the field plate electrode in a depth direction of the trench;

(g) after the step(f), forming a gate insulating film on the semiconductor substrate inside the trench, and forming a second insulating film on an upper surface and a side surface of the field plate electrode exposed from the first insulating film;

(h) after the step (g), forming a gate electrode so as to fill the inside of the trench on the field plate electrode retreated in the step (e);

(i) after the step(h), forming an interlayer insulating film on the upper surface of the semiconductor substrate so as to cover the trench;

(j) after the step (i), forming a first hole, a second hole, and a third hole in the interlayer insulating film; and (k) after the step (j), forming a source electrode and a gate wiring surrounding the source electrode in a plan view on the interlayer insulating film respectively, wherein the gate electrode includes a first end portion and a second end portion located on an opposite side of the first end portion in the first direction in a plane view, wherein the field plate electrode further includes a contact portion at the upper portion inside the trench which is located between the first end portion and the second end portion of the gate electrode in a plan view, wherein the first hole is formed so as to overlap the first end portion of the gate electrode in a plan view, wherein the second hole is formed so as to overlap the second end portion of the gate electrode in a plan view, wherein the third hole is formed so as to overlap the contact portion of the field plate electrode in a plan view, wherein the gate wiring is embedded in the first hole and the second hole and is electrically connected to the gate electrode, wherein the source electrode is embedded in the third hole and electrically connected to the field plate electrode, and wherein a connecting portion of the gate electrode is formed in the step (h), such that the connecting portion electrically connects the first end portion with the second end portion in the trench at the contact portion of the field plate electrode.

According to the above embodiments, the reliability of the semiconductor device can be improved.

BRIEF DESCRIPTION OF THE DRAWINGS

FIG. 1 is a plan view showing a semiconductor device according to a first embodiment.

FIG. 4 is a cross-sectional view showing the semiconductor device according to the first embodiment.

FIG. 5 is a cross-sectional view showing the semiconductor device according to the first embodiment.

FIG. 6 is a cross-sectional view showing a manufacturing process of the semiconductor device according to the first embodiment.

FIG. 10 is a cross-sectional view showing a manufacturing process following FIG. 9.

FIG. 12 is a cross-sectional view showing a manufacturing process following FIG. 11.

FIG. 19 is a cross-sectional view showing a manufacturing process following FIG. 18.

FIG. 20 is a cross-sectional view showing a manufacturing process following FIG. 19.

DETAILED DESCRIPTION

Figure 2:
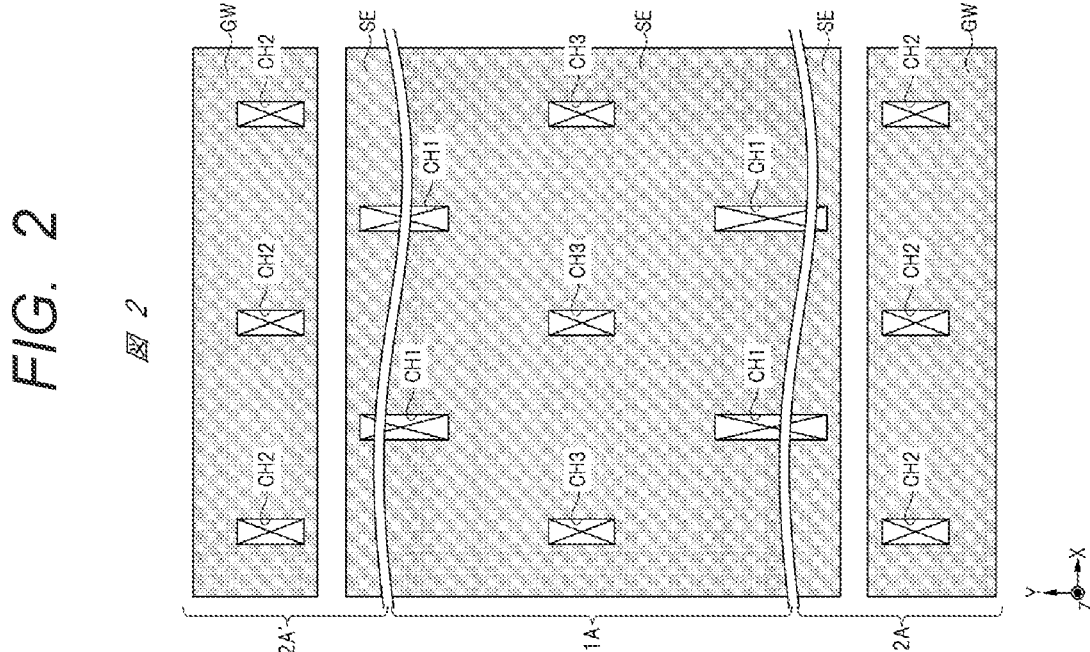
FIG. 2 is an enlarged plan view showing a main part of the semiconductor device according to the first embodiment.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, X direction, Y direction, and Z direction described in the present application intersect each other and are orthogonal to each other. In the present application, the Z direction is described as a vertical direction, a height direction, or a thickness direction of a certain structure.

In addition, the expression "plan view" used in the present application means that the plane formed by the X direction and the Y direction is a "plane" and the "plane" is viewed from the Z direction.

Figure 1:
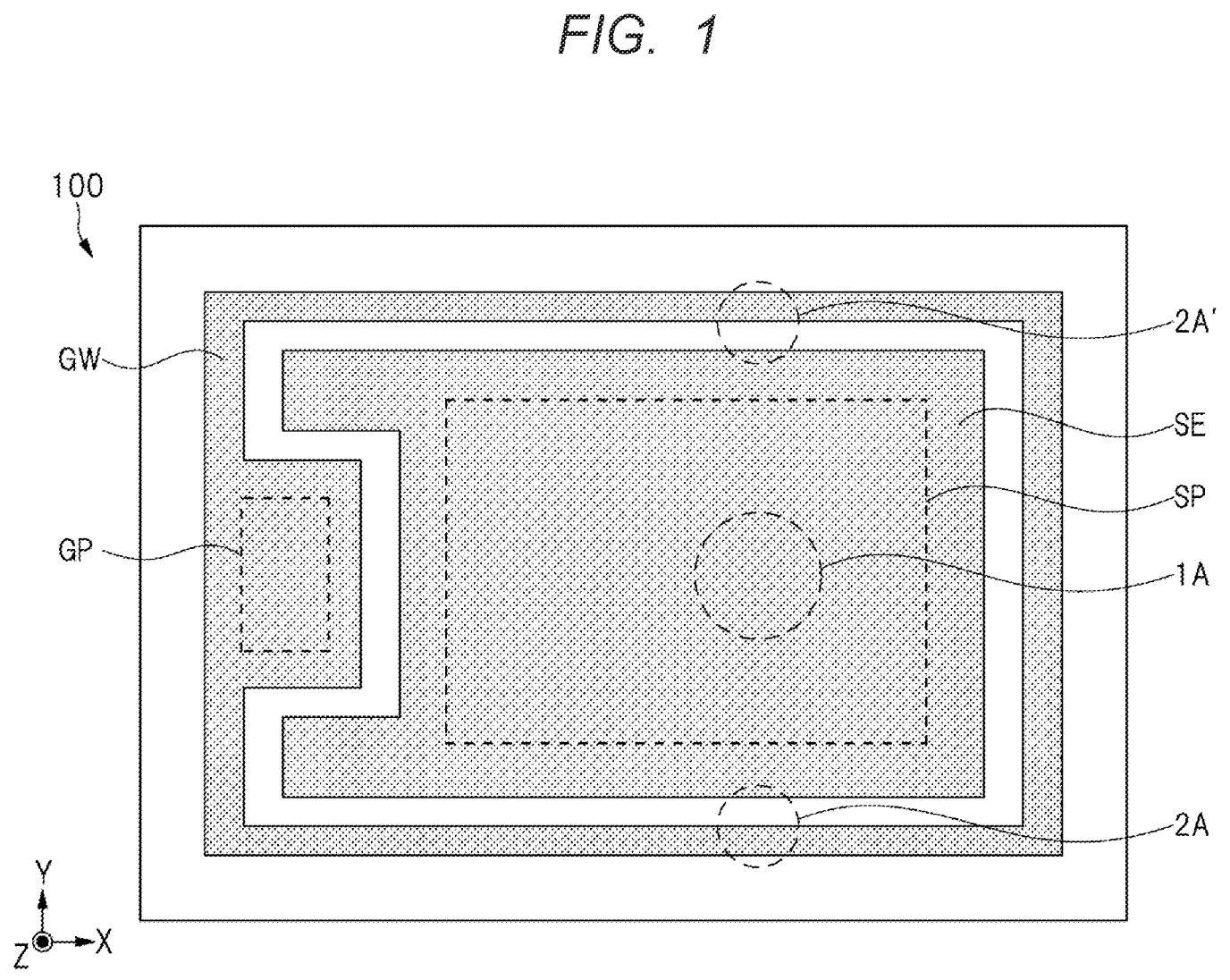

A semiconductor device 100 according to the first embodiment will be described below with reference to FIGS. 1 to 5. The semiconductor device 100 includes a MOSFET having a trench gate structure. In particular, the MOSFET has a split gate structure including a gate electrode GE and a field plate electrode FP.

FIG. 1 is a plan view of a semiconductor chip that is a semiconductor device 100. FIG. 1 shows wiring patterns formed mainly above a semiconductor substrate SUB. FIG.

2 is an enlarged plan view of a part of FIG. 1. FIG. 3 shows a lower structure of FIG. 2 and shows a structure of a trench gate formed in the semiconductor substrate SUB.

As shown in FIG. 1, most of the semiconductor device 100 is covered with a source electrode (fixed potential supply line) SE. A gate wiring GW is provided along the outer periphery of the semiconductor device 100 and surrounds the source electrode SE in a plan view. Although not illustrated here, the source-electrode SE and the gate-wiring GW are covered with a protective film such as a polyimide film. Opening are provided in parts of the protective film, and the source electrode SE and the gate line GW exposed in the openings become the source pad SP and the gate pad GP. External connecting members such as bonding wires or clips (copper plates) are connected to the source pad SP and the gate pad GP, so that the semiconductor device 100 is electrically connected to another semiconductor chip, a wiring board, or the like.

The semiconductor device 100 includes a region LA and regions 2A and 2A' surrounding the region LA in plan view. The region LA is a cell region in which main semiconducting elements such as a plurality of MOSFET are formed. The regions 2A and 2A' are an outer peripheral region used for connecting the gate wiring GW with the gate electrode GE and the like.

Figure 3:
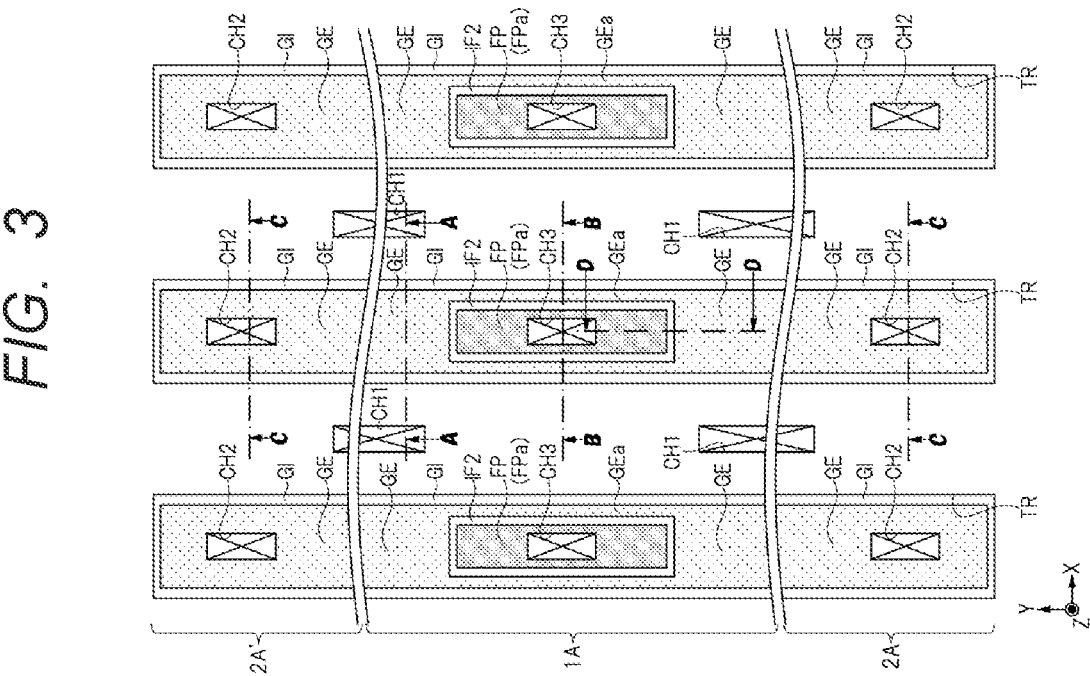
FIG. 3 is an enlarged plan view showing a main part of the semiconductor device according to the first embodiment.

The positional relationship of holes CH1~CH3 shown in FIG. 3 coincides with the positional relationship of the holes CH1~CH3 shown in FIG. 2. Note that the structure of the region 2A' is obtained by inverting the structure of the region 2A in the drawing. Therefore, as in C-C cross-section of FIG. 5, the cross-sectional structure of the region 2A' is the same as the cross-sectional structure of the region 2A.

As shown in FIG. 3, a plurality of trenches TR extend in the Y direction and adjoin each other in the X direction. The respective trenches TR are, for example, 1.5 μm or more and 1.8 μm or less in the X-direction.

Inside the trench TR, a field plate (fixed potential electrode) electrode FP is formed at a lower portion of the trench TR, and a gate electrode GE is formed at un upper portion of the trench TR. Therefore, in FIG. 3, the gate-electrode GE is exposed. The field plate electrode FP and the gate electrode GE extend in the Y-direction along the trench TR.

A part of the field plate electrode FP forms a contact portion FPa. The field plate electrodes FP constituting the contact portions FPa are formed not only at the lower portion of the trench TR but also at the upper portion of the trench TR in the region 1A. Therefore, in FIG. 3, the contact portion FPa is exposed.

The contact portion FPa divides the gate-electrode GE into the region 2A and the region 2A'. However, the gate-electrode GE includes a connecting portion GEa. The connecting portion GEa connects the gate electrode GE on the region 2A side and the gate electrode GE on the region 2A' side inside the trench TR in which the contact portion FPa is formed. The connecting portions GEa are formed on both side surfaces of the contact portion FPa via the insulating film IF2 in the X-direction.

Figure 4:
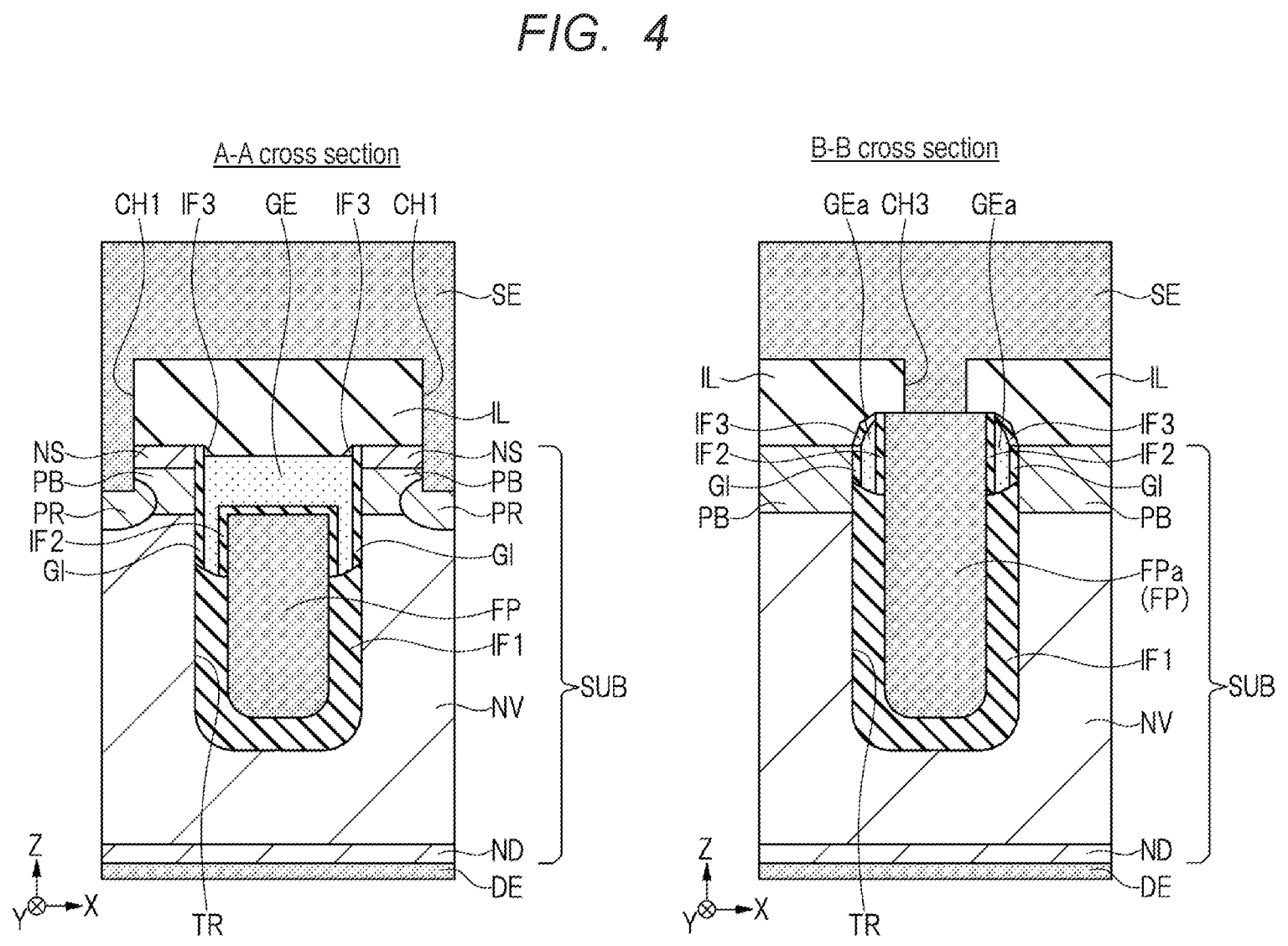
Figure 5:
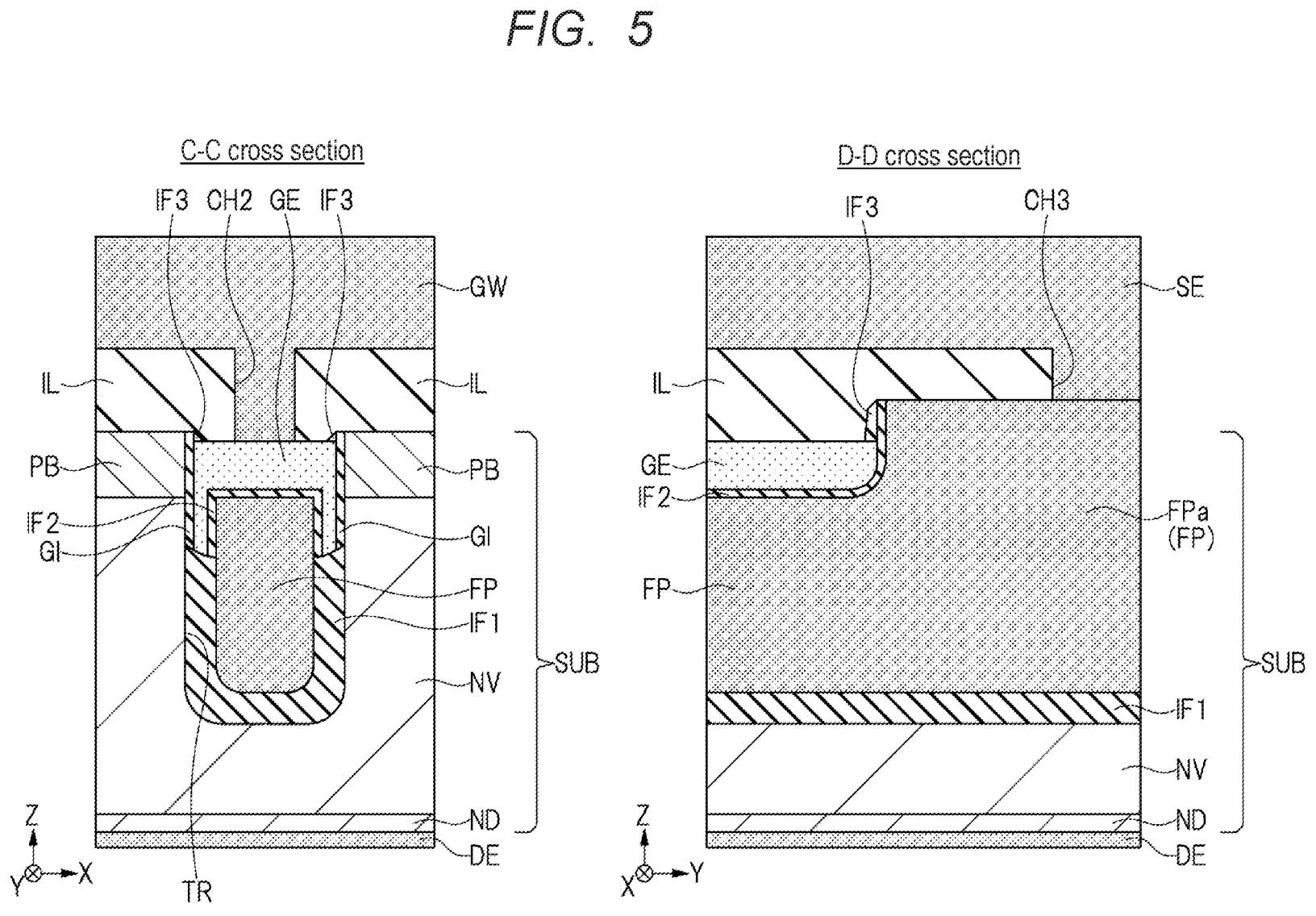

A cross sectional structure of the semiconductor device 100 will be described below with reference to FIGS. 4 and 5. FIG. 4 is a cross-sectional view taken along A-A and B-B lines shown in FIG. 3. FIG. 5 is a cross-sectional view taken along C-C and D-D lines shown in FIG. 3.

First, the basic structure of MOSFET will be described with reference to A-A cross section of FIG. 4. The semiconductor device 100 includes a semiconductor substrate SUB having an upper surface and a lower surface. The semiconductor substrate SUB has a low concentration n-type drift region NV. Here, the n-type semiconductor substrate SUB itself constitute the drift region NV. Note that the drift region NV may be an n-type semiconductor layer grown on an n-type silicon substrate while introducing phosphorus (P) by an epitaxial growth method. In the present application, a laminated body formed of such n-type silicon substrate and n-type semiconductor layer is also described as being the semiconductor substrate SUB.

A plurality of trenches TR1 that reach a predetermined depth from the upper surface of the semiconductor substrate SUB are formed in the semiconductor substrate SUB. The depth of each trench is, for example, 5 μm or more and 7 μm or less. Inside the trench TR, the field plate electrode FP is formed at the lower portion of the trench TR via an insulating film IF1. The position of an upper surface of the insulating film IF1 is lower than a position of an upper surface of the field plate FP. An insulating film IF2 is formed on an upper surface and a side surface of the field plate electrode FP exposed from the insulating film IF1. A gate-insulating film GI is formed on the semiconductor substrate SUB inside the trench TR.

In the trench TR, the gate electrode GE is formed at the upper portion of the trench TR. The gate electrode GE is electrically insulated from the field plate electrode FP by the insulating film IF2, and is electrically insulated from the semiconductor-substrate SUB by the gate insulating film GI. The gate electrode GE is also formed between the field plate electrode FP exposed from the insulating film IF1 and the semiconductor substrate SUB with the gate insulating film GI and the insulating film IF2 interposed therebetween.

The upper surface of the gate-electrode GE is slightly retreated from the upper surface of the semiconductor substrate SUB. An insulating film IF3 is formed on a part of the upper surface of the gate electrode GE so as to be in contact with the gate insulating film GI.

The gate electrode GE and the field plate electrode FP are made of, for example, an n-type doped polycrystalline silicon film. The insulating film IF1, the insulating film IF2, the insulating film IF3, and the gate-insulating film GI are made of, for example, a silicon oxide film.

The thickness of the insulating film IF1 is larger than the thickness of each of the insulating film IF2, the insulating film IF3, and the gate insulating film GI. The thickness of the dielectric film IF1 is, for example, 400 nm or more and 600 nm or less. The thickness of each of the insulating film IF2 and the gate-insulating film is, for example, not less than 50 nm and not more than 80 nm. The thickness of the dielectric film IF3 is, for example, 30 nm or more and 80 nm or less.

On the upper surface of the semiconductor substrate SUB, a p-type body region PB is formed on the semiconductor substrate SUB so as to be shallower than the trench TR. In the body region PB, an n-type source region NS is formed. The source region NS has a higher impurity concentration than the drift region NV.

On the lower surface of the semiconductor substrate SUB, an n-type drain-region ND is formed on the semiconductor substrate SUB. The drain region ND has a higher impurity concentration than the drift region NV. A drain electrode DE is formed under the lower surface of the semiconductor substrate SUB. The drain electrode DE constitutes a single layer of metallic membranes, such as aluminum membranes, titanium membranes, nickel membranes, gold membranes or silver membranes, or laminated membranes with these metallic membranes laminated accordingly.

An interlayer insulating film IL is formed on the upper surface of the semiconductor substrate SUB so as to cover the trench TR. The interlayer dielectric film IL is formed of, for example, a silicon oxide film. The thickness of the interlayer dielectric film IL is, for example, 700 nm or more and 900 nm or less. The interlayer dielectric film IL may be a laminated film of a thin silicon oxide film and a thick silicon oxide film containing phosphorus (PSG: Phosphorus Silicate Glass film).

A hole CH1 is formed in the interlayer insulating film IL, in the source region NS and in the body region PB. At the bottom of the hole CH1, a high concentration region PR is formed in the body region PB. The high concentration region PR has a higher impurity concentration than the body region PB. A source electrode SE is formed on the interlayer insulating film IL. The source electrode SE is embedded in the hole CH1. The source electrode SE is electrically connected to the source region NS, the body region PB, and the high-concentration region PR, and supplies a source potential (fixed potential) to these regions.

As shown in C-C cross section of FIGS. 3 and 5, the gate-electrode GE includes a first end portion on the region 2A side and a second end portion on the region 2A' side in the Y-direction. Holes CH2 are formed in the interlayer insulating film IL. The hole CH2 on the region 2A side is formed so as to overlap with the first end portion of the gate electrode GE in a plan view, and the hole CH2 on the region 2A' side is formed so as to overlap with the second end portion of the gate electrode GE in a plan view.

Note that the "first end portion of the gate electrode GE" described in this specification is a portion of the gate electrode GE where the hole CH2 of the region 2A is provided, and is a portion adjoining the body region PB where the source region NS is not formed, as in C-C cross section of FIG. 5. Similarly, the "second end portion of the gate electrode GE" described in this specification is a portion of the gate electrode GE where the hole CH2 of the region 2A' is provided, and is a portion adjoining the body region PB where the source region NS is not formed, as in C-C cross section of FIG. 5.

A gate wiring GW is formed on the interlayer insulating film IL. The gate wiring GW is embedded in the hole CH2. The gate wiring GW is electrically connected to the gate electrode GE and supplies a gate potential to the gate electrode GE.

As shown in B-B cross-section of FIGS. 3 and 4 and D-D cross-section of FIG. 5, a portion of the field plate electrode FP forms a contact portion FPa of the field plate electrode FP. The contact portion FPa is formed not only in the lower portion of the trench TR but also in the upper portion of the trench TR in the trench TR located between the gate electrode GE on the region 2A side (the first end portion side) and the gate electrode GE on the region 2A' side (the second end portion side).

In addition, the position of the upper surface of the insulating film FPa in contact with the field plate electrode FP other than the contact portion IF1 is lower than the position of the upper surface of the insulating film IF1 in contact with the contact portion. That is, the position of the upper surface of the insulating film IF1 of A-A cross section is located at a depth of not less than 700 nm and not more than 900 nm from the upper surface of the semiconductor-substrate SUB. The position of the upper surface of the insulating film IF1 in B-B cross section is located at a depth of not less than 600 nm and not more than 800 nm from the upper surface of the semiconductor substrate SUB.

In addition, the position of the upper surface of the contact portion FPa is higher than the position of the upper surface of the semiconductor substrate SUB, and is located at a height equal to or higher than 200 nm and equal to or lower than 400 nm from the upper surface of the semiconductor substrate SUB.

The connecting portions GEa are formed on both side surfaces of the contact portion FPa via the insulating film IF2 in the X-direction. The connecting portions GEa extend in the Y-direction and connects the gate electrode GE on the region 2A side (the first end portion side) and the gate electrode GE on the region 2A' side (the second end portion side). The gate electrode GE and the connecting portion GEa are formed of an integrated n-type polycrystalline silicon film. Therefore, the gate potential is also supplied to the connecting portion GEa from the gate wiring GW. The connecting portion GEa is covered with the insulating film IF3.

A hole CH3 is formed in the interlayer insulating film IL. The hole CH3 is formed so as to overlap the contact portion FPa in a plan view. The source electrode SE is embedded in the hole CH3. The source electrode SE is electrically connected to the field plate electrode FP, and supplies a source potential to the field plate electrode FP.

In addition, the source electrode SE and the gate wiring GW include, for example, a barrier metal film and a conductive film formed on the barrier metal film. The barrier metal film is, for example, a titanium nitride film, and the conductive film is, for example, an aluminum film.

The source electrode SE and the gate wiring GW may include a plug layer filling the holes CH1~CH3 and a wiring layer formed on the interlayer insulating film IL. In this case, the wiring layer is composed of the barrier metal film and the conductive film. The plug layer includes a barrier metal film such as a titanium nitride film and a conductive film such as a tungsten film.

The Main Feature of the First Embodiment

In the lower side of the source electrodes SE, expose the contact portion FPa of the field plate electrodes FP from the semiconductor substrates SUB, and connect the source electrode SE and the contact portion FPa through the hole CH3. Therefore, as shown in FIG. 3, since the gate electrode GE is divided by the contact portion FPa, in the region 2A and the region 2A', the divided gate electrode GE and the gate iwiring GW need to be connected via the hole CH2.

Here, there is a possibility that, for example, the hole CH2 of either the region 2A or the region 2A' becomes a nonopening due to an inadequate etch rate at the time of forming the hole CH2. As a result, MOSFET using either the gate-electrode GE of the region 2A or the region 2A' does not function.

In this regard, in the first embodiment, the connecting portions GEa are provided on the side surface of the contact portion FPa. The connecting portion GEa connects the gate electrode GE on the region 2A side (the first end portion side) and the gate electrode GE on the region 2A' side (the second end portion side). Therefore, for example, even when the hole CH2 of the region 2A is non-open and the gate potential is not directly supplied to the gate electrode GE on the region 2A side, the gate potential is supplied to the gate electrode GE on the region 2A side from the gate electrode GE on the region 2A' side via the connecting portion GEa. That is, the gate wiring GW in the first embodiment is in direct contact with at least one of the first end portion of the gate electrode GE on the region 2A side or the second end portion of the gate electrode GE on the region 2A' side.

As described above, according to the first embodiment, since MOSFET using the gate-electrode GE can function normally, the reliability of the semiconductor device 100 can be improved.

Incidentally, as another exemplary layout of the gate wiring GW and the source electrode SE, it is conceivable that the gate wiring GW is traversed in the X-direction from the gate pad GP and the gate wiring GW is connected to the gate electrode GE at the position of the hole CH3. Then, the source electrode SE is divided, and the contact portions FPa of the field plate electrode FP and the source electrode SE are connected to each other at the positions of the hole CH2 in the regions 2A and 2A'. As a result, the gate-electrode GE is not divided.

However, in this example, separate external connecting members need to be connected to the separated source electrode SE. Therefore, the layout of the semiconductor device becomes inefficient, and the manufacturing process and the manufacturing cost for connecting the separate external connection members are increased. Therefore, as in the first embodiment, it is more efficient to dispose the gate wiring GW on the outer periphery of the source electrode SE.

A method of manufacturing the semiconductor device 100 will be described below with reference to FIGS. 6 to 21. In the following explanation, A-A cross section and B-B cross section of FIG. 4 are mainly used, but C-C cross section and D-D cross section of FIG. 5 are also used as required.

Figure 6:
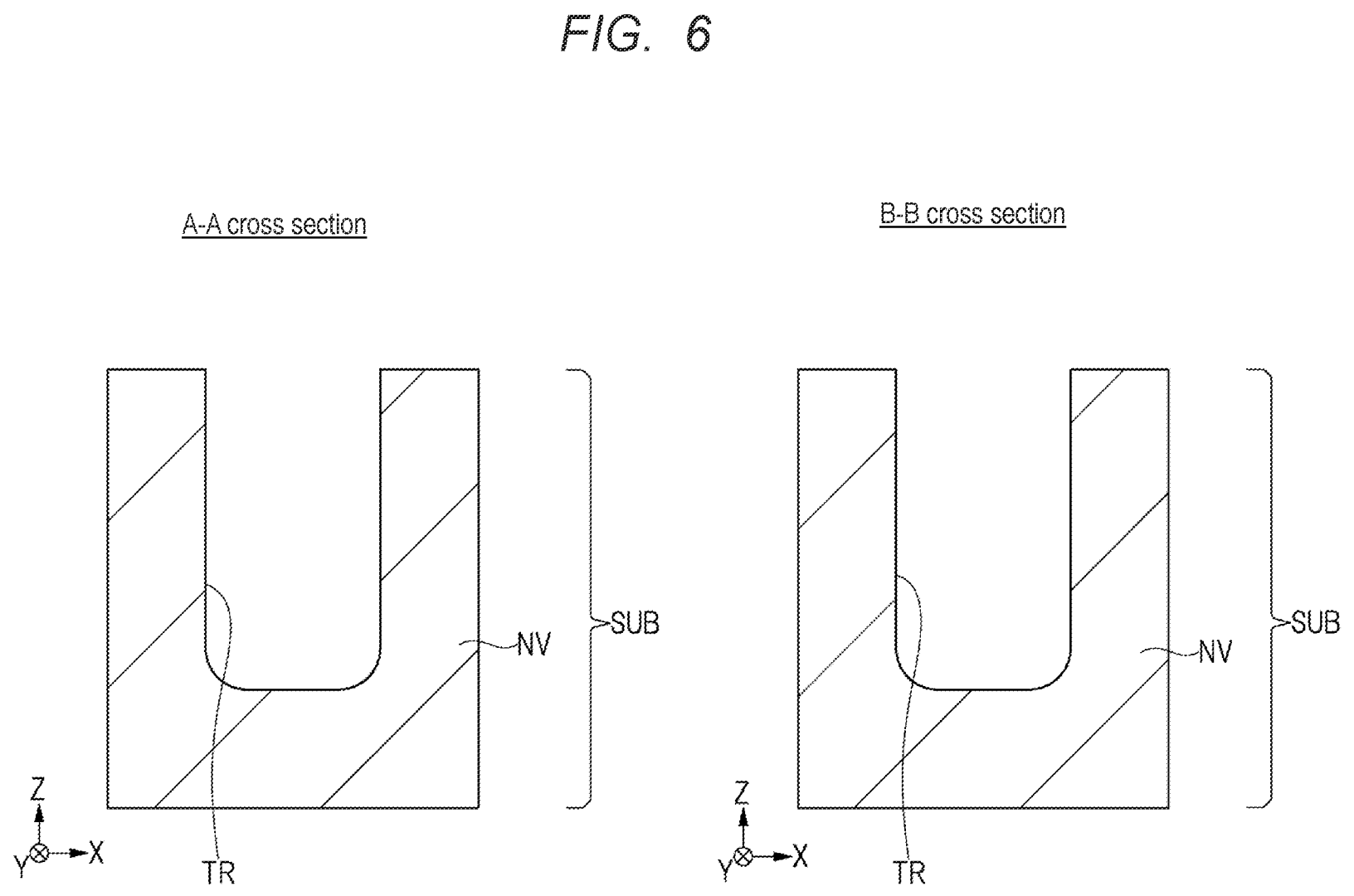

As shown in FIG. 6, a semiconductor substrate SUB having an upper surface and a lower surface and having an n-type drift-region NV is prepared. As described above, the n-type semiconductor substrate SUB itself constitute the drift region NV, but the drift region NV may be an n-type semiconductor layer grown on an n-type silicon substrate while introducing phosphorus (P) by epitaxial growth method.

Next, a trench TR is formed in the semiconductor substrate SUB. In order to form the trench TR, for example, a silicon-oxide film is first formed on the semiconductor substrate SUB by, for example, CVD(Chemical Vapor Deposition). Next, a resist pattern having an opening is formed on the silicon oxide film by a photolithography technique. Next, a dry etching process is performed using the resist pattern as a mask to pattern the silicon oxide film. Next, the resist pattern is removed by asking process. Next, the trench TR is formed in the semiconductor substrate SUB by performing a dry etching process using the silicon oxide film as a mask. Thereafter, the silicon oxide film is removed by a wet etching process using, for example, a solution containing hydrofluoric acid.

Figure 7:
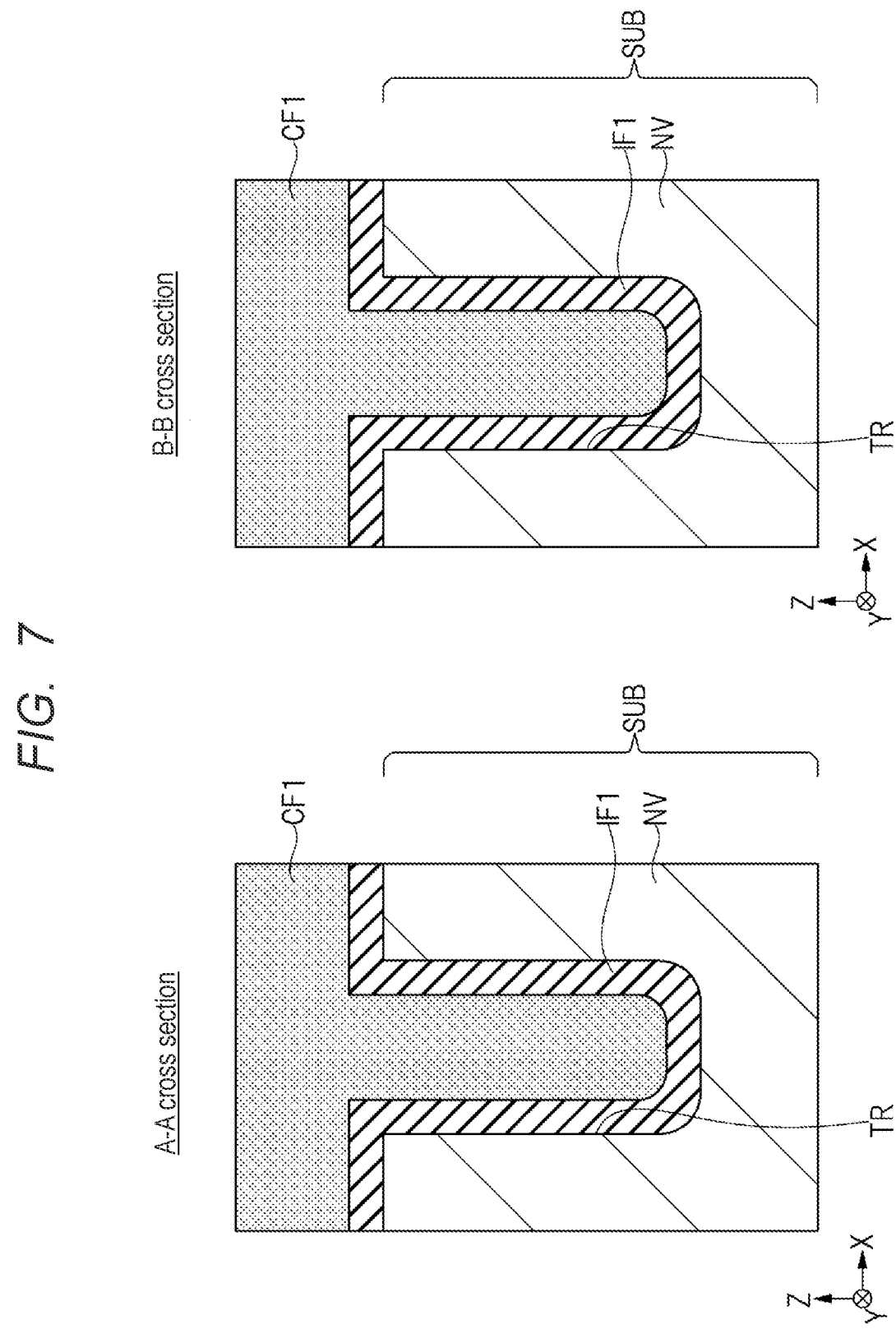
FIG. 7 is a cross-sectional view showing a manufacturing process following FIG. 6.

As shown in FIG. 7, first, thermal oxidation treatment is performed to form an insulating film IF1 made of, for example, a silicon oxide film on the semiconductor substrate SUB including an inside of the trench TR. The insulating film IF1 may be a stacked film of a thin silicon oxide film formed by a thermal oxidation treatment and a thick silicon oxide film formed by a CVD method. Next, a conductive film CF1 is formed on the semiconductor substrate SUB by a CVD method so as to fill the trench TR via the insulating film IF1. The conductive film CF1 is formed of, for example, an n-type polycrystalline silicon film.

Figure 8:
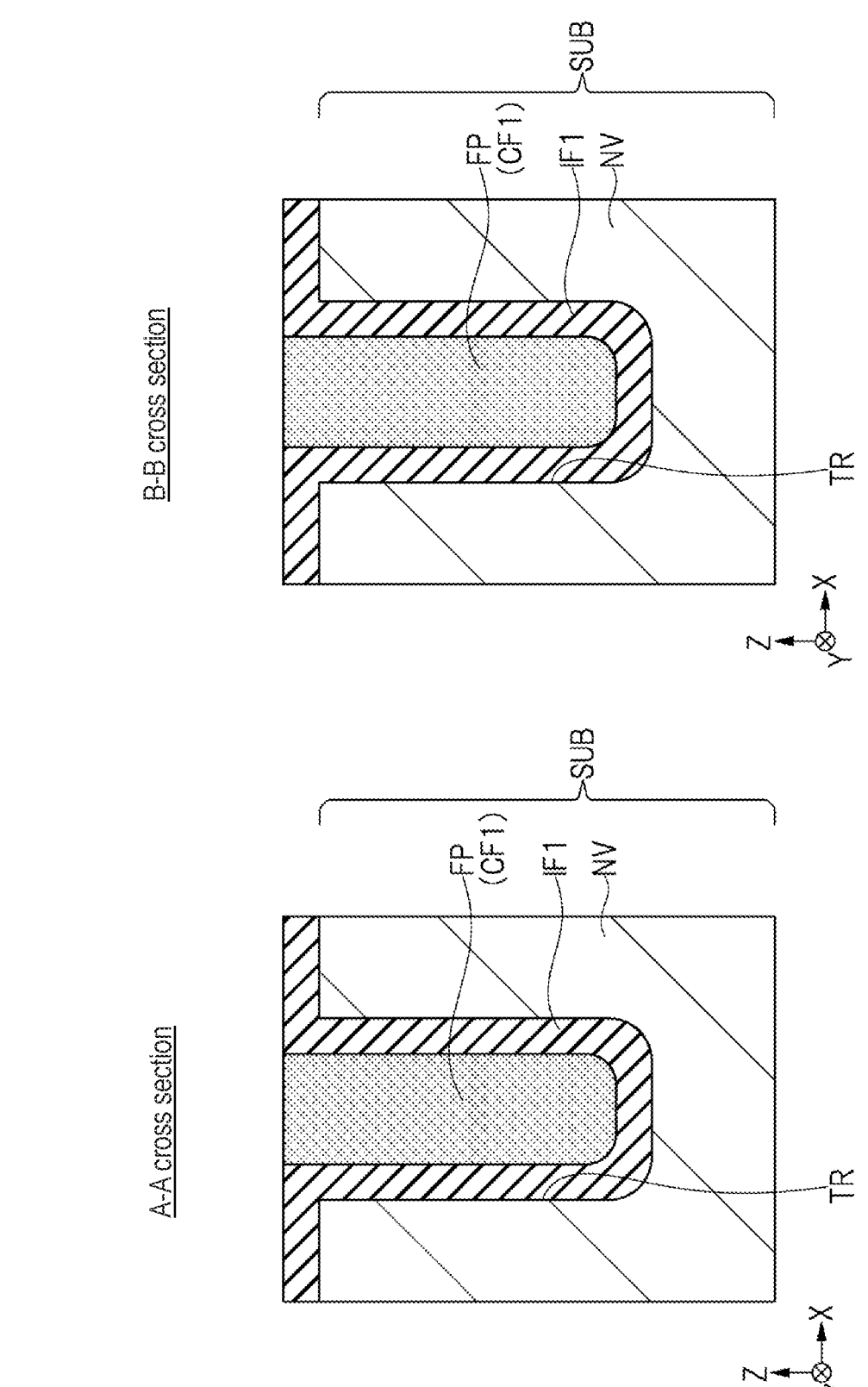
FIG. 8 is a cross-sectional view showing a manufacturing process following FIG. 7.

As shown in FIG. 8, the conductive film CF1 formed outside the trench TR is removed by performing a polishing process using CMP(Chemical Mechanical Polishing) method. In this manner, the field plate FP is formed so as to fill the trench TR via the insulating film IF1.

Figure 9:
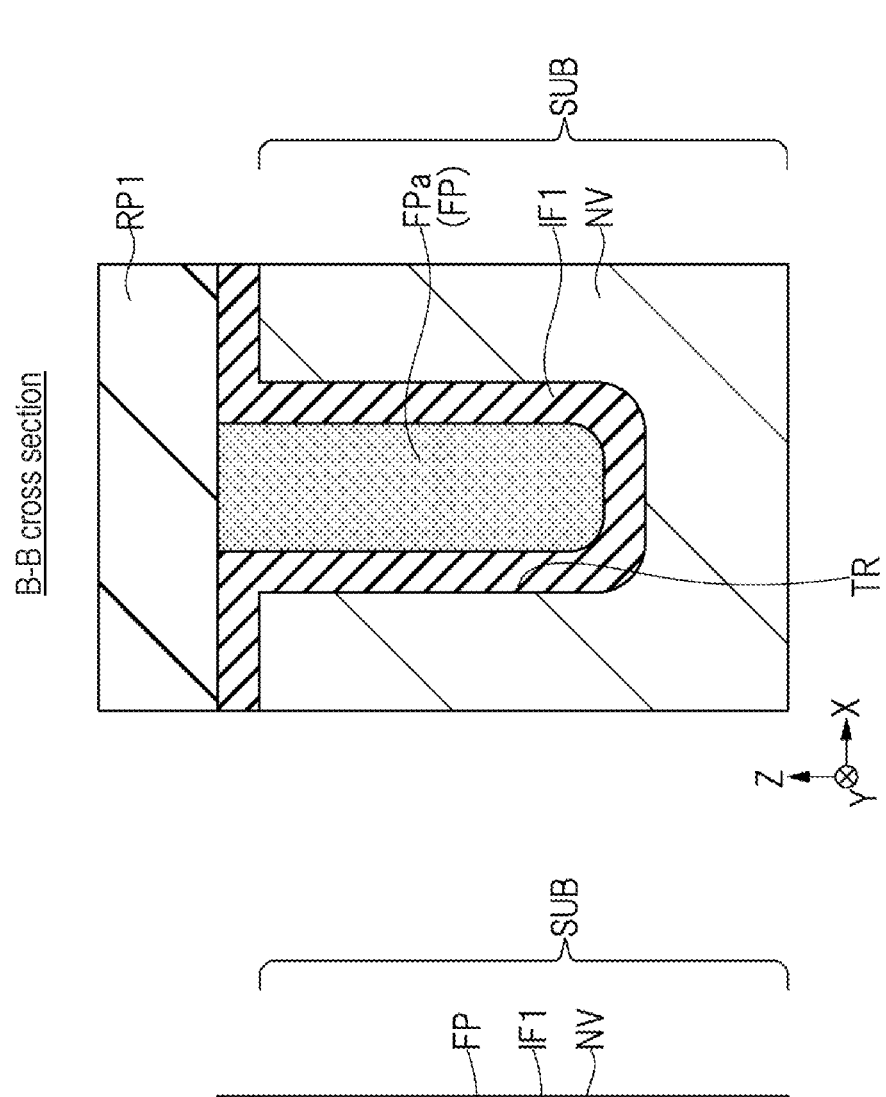
FIG. 9 is a cross-sectional view showing a manufacturing process following FIG. 8.
Figure 9:
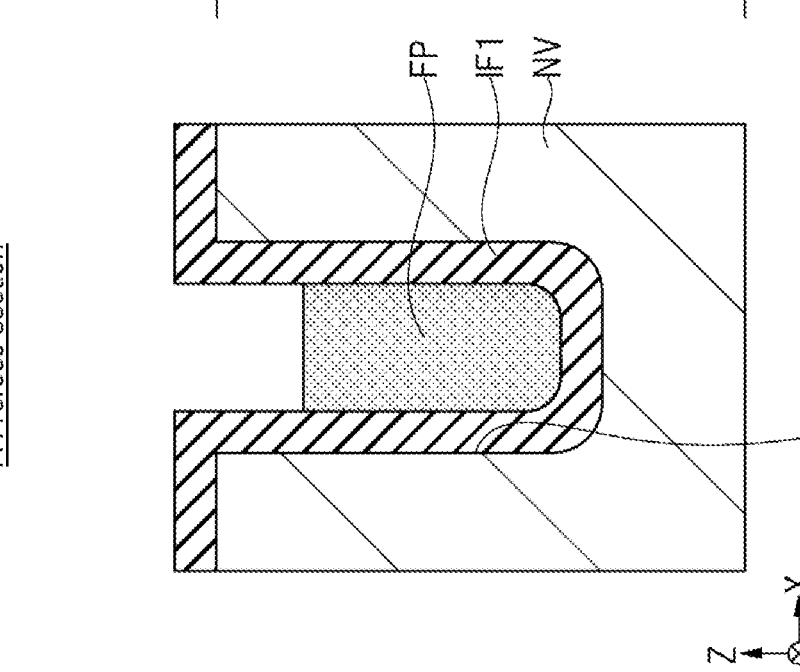

As shown in FIG. 9, the other part (see A-A cross section) of the field plate electrode FP is selectively retracted so that a portion of the field plate electrode FP is left as a contact portion FPa (see B-B cross section). First, a resist pattern RP1 is formed to selectively cover a region to be contact portions FPa. Next, dry etching process is performed using the resist pattern RP1 as a mask. Accordingly, the field plate FP other than the contact portion FPa is selectively retracted.

Figure 10:
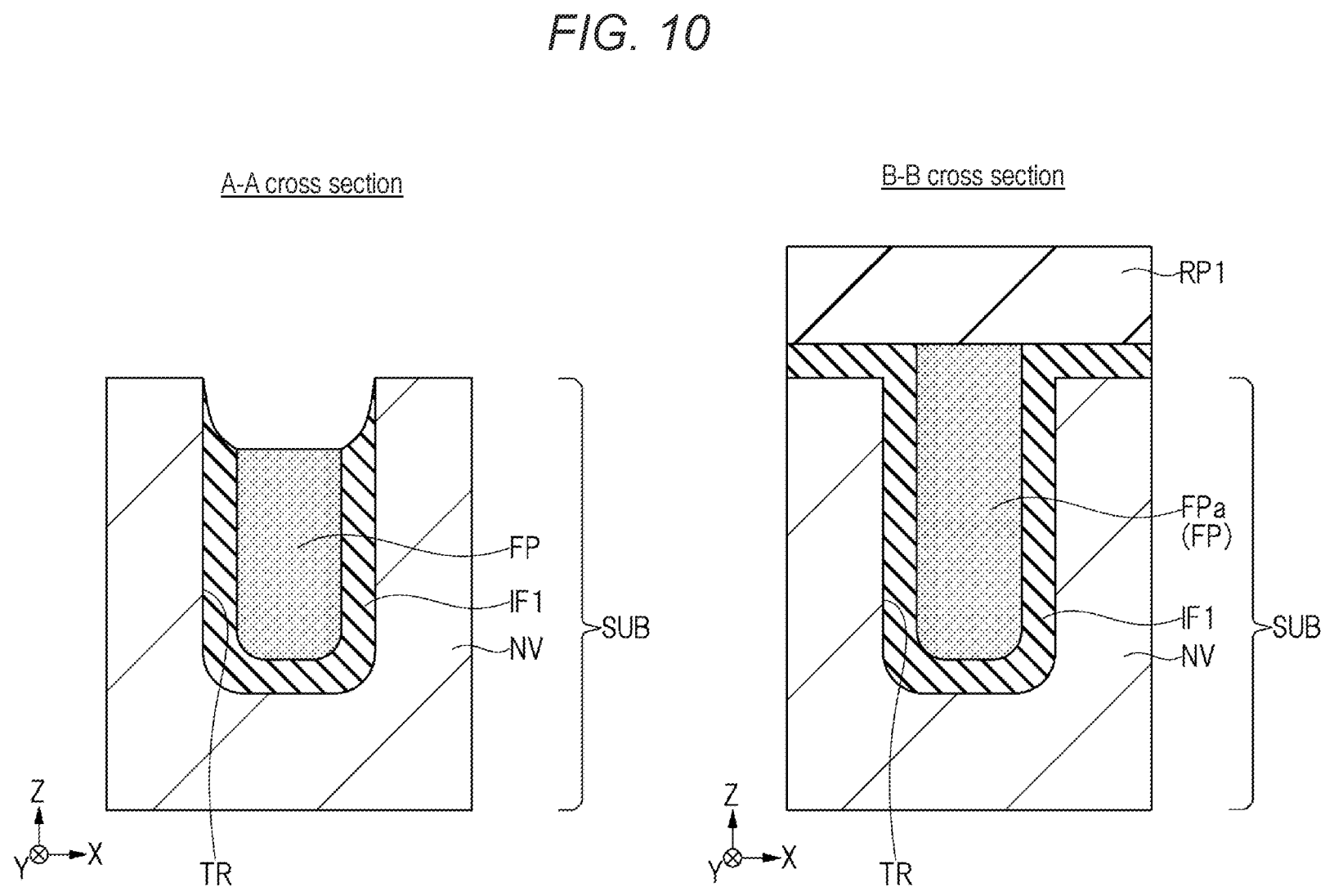
Figure 11:
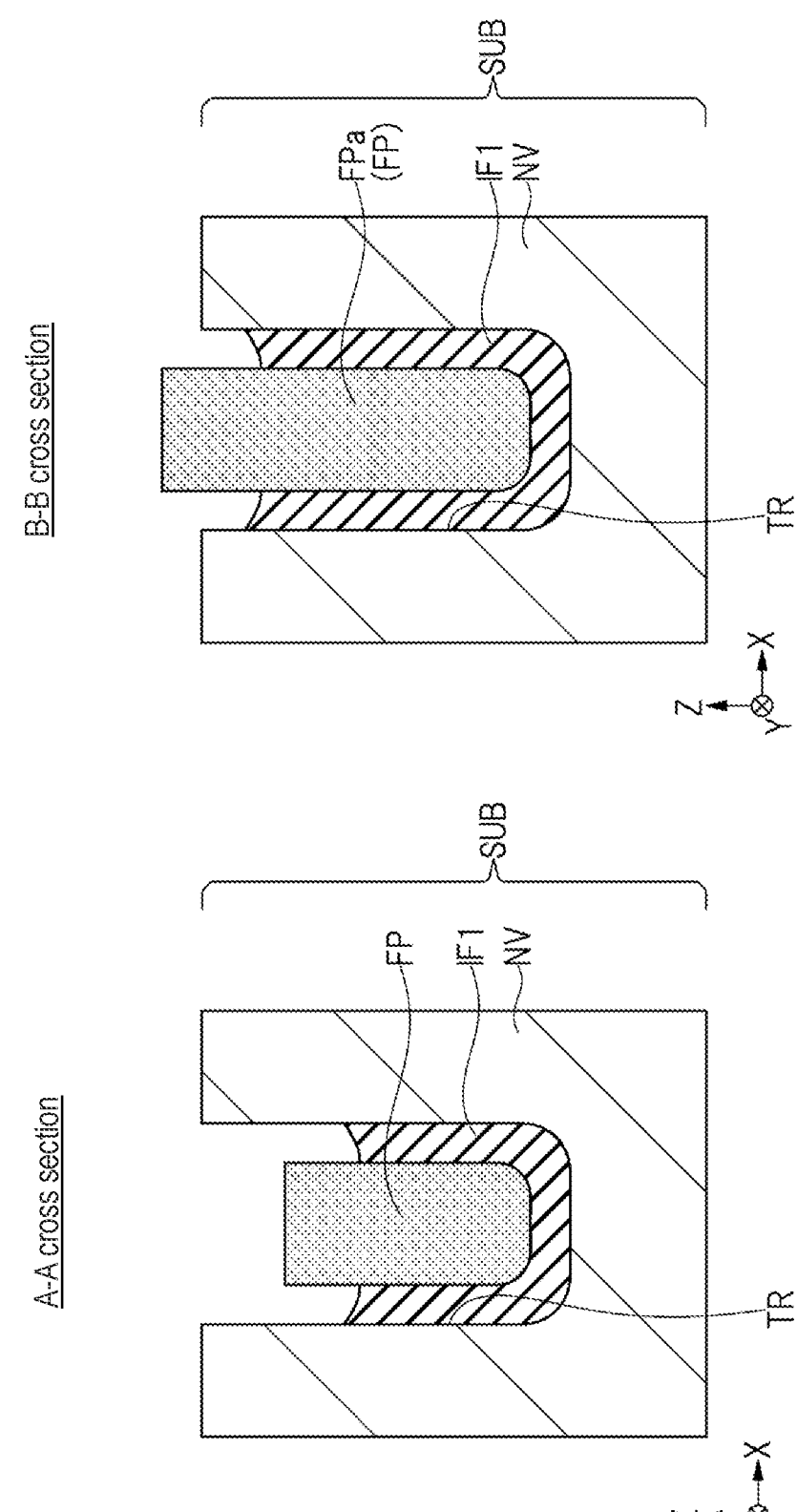
FIG. 11 is a cross-sectional view showing a manufacturing process following FIG. 10.

As shown in FIGS. 10 and 11, in the trench TR, the insulating film IF1 is retracted so that a position of an upper surface thereof is lower than a position of an upper surface of the field plate electrode FP. First, as shown in FIG. 10, a wet etching process using, for example, a hydrofluoric acid-containing solution is performed using the resist pattern RP1 as a mask. As a result, the insulating film IF1 on the semiconductor substrate SUB is removed outside the periphery of the contact portion FPa, and the insulating film IF1 inside the trench TR is retracted. Next, the resist pattern RP1 is removed by asking process.

Next, as shown in FIG. 11, the entire surface of the semiconductor substrate SUB is subjected to a wet etching process using, for example, hydrofluoric acid-containing solutions. As a result, in the vicinity of the contact portion FPa, the insulating film IF1 on the semiconductor substrate SUB is removed, the insulating film IF1 formed on a side surface of the field plate electrode FP is retracted, and an upper portion of the field-plate electrode FP is exposed.

At this point, the position of the upper surface of the insulating film IF1 in contact with the field plate electrode FP other than the contact portion FPa is lower than the position of the upper surface of the insulating film IF1 in contact with the contact portion FPa. Further, by removing the insulating film IF1 on the semiconductor substrate SUB, the position of the upper surface of the contact portion FPa is higher than a position of an upper surface of the semiconductor substrate SUB.

Since a stepped portion is generated between the upper surface of the contact portion FPa and the upper surface of the insulating film IF1, the connecting portion GEa described later is easily processed into a sidewall shape, and the connecting portion GEa is easily left on both side surfaces of the contact portion FPa.

Figure 12:
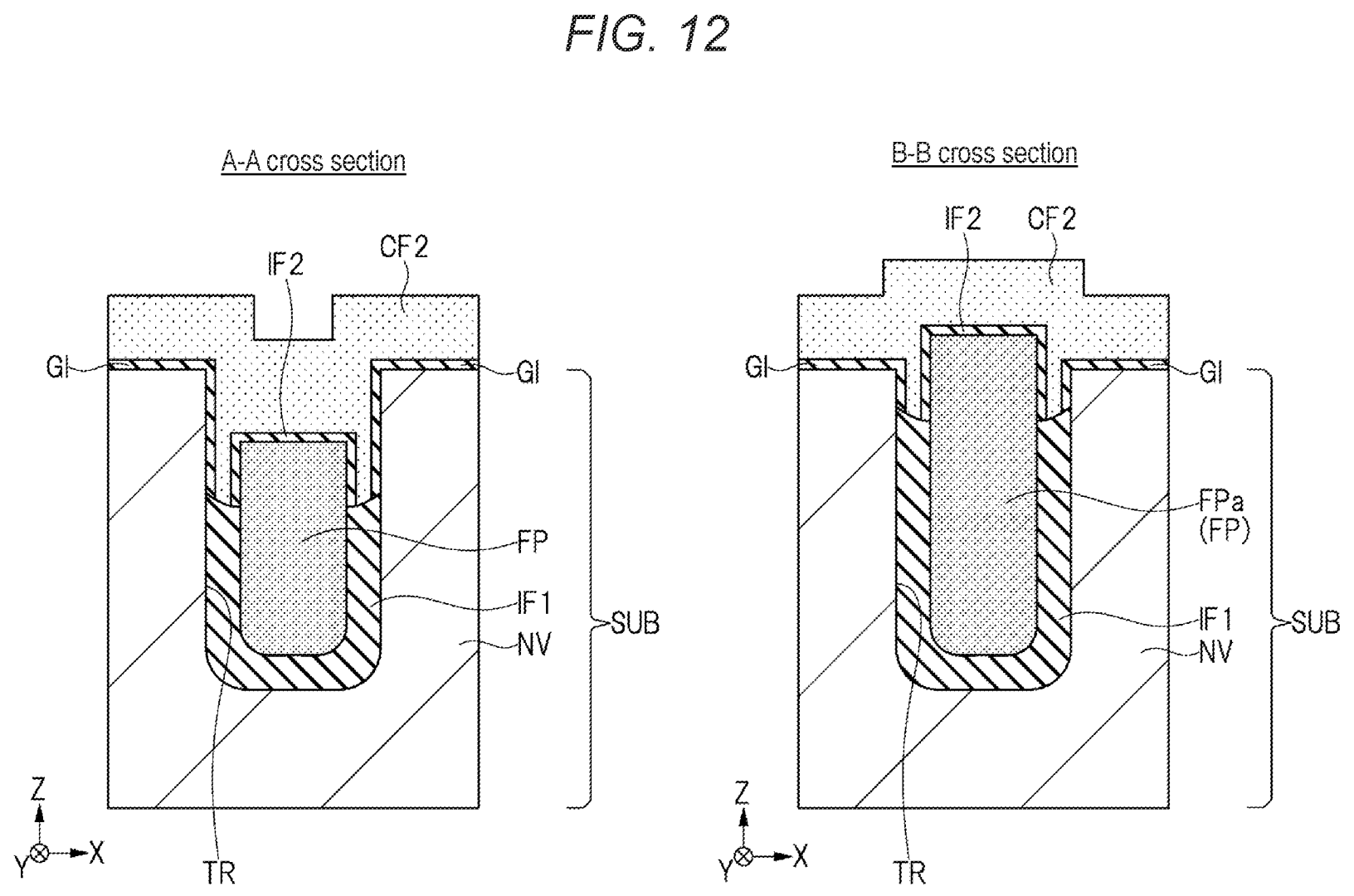

As shown in FIG. 12, a gate insulating film GI made of, for example, a silicon oxide film is formed on the semiconductor substrate SUB including the inside of the trench TR by performing a thermal oxidation treatment. By the thermal oxidation treatment, an insulating film IF2 is formed on an upper surface and a side surface of the field plate electrode FP exposed from the insulating film IF1.

Next, a conductive film CF2 is formed on the semiconductor substrate SUB including the inside of the trench TR by, for example, a CVD method so as to fill the inside of the trench TR on the field plate electrode FP which is retracted in the step of FIG. 9 (see A-A cross section). Here, the conductive film CF2 is also formed inside the trench TR in which the contact portion FPa is formed (see B-B cross section). The conductive film CF2 is formed of, for example, an n-type polycrystalline silicon film.

Figure 13:
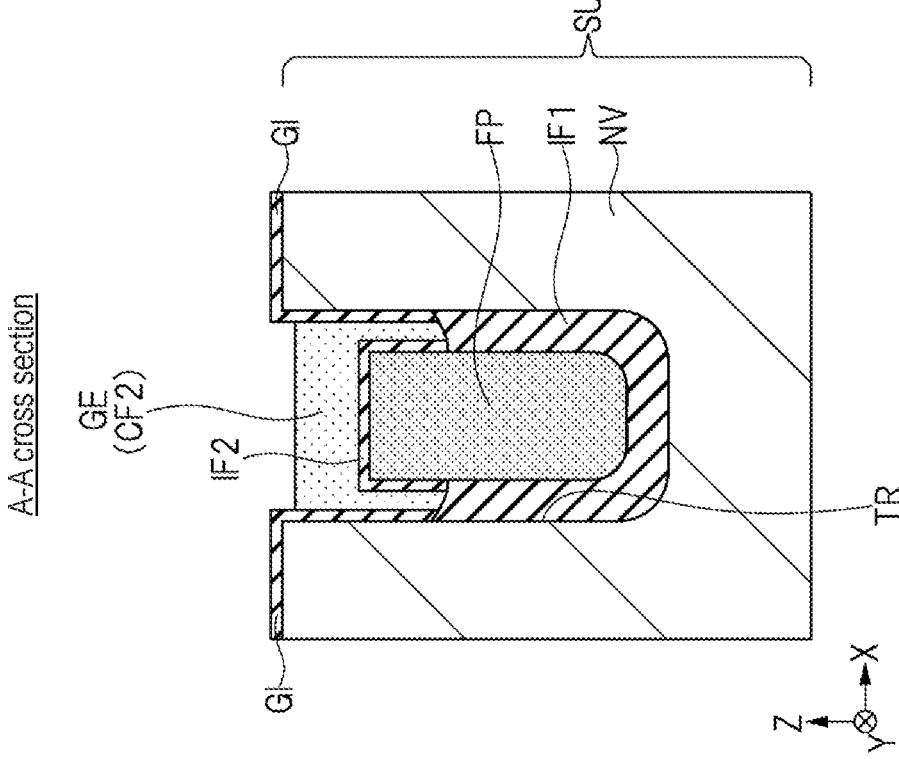
FIG. 13 is a cross-sectional view showing a manufacturing process following FIG. 12.
Figure 14:
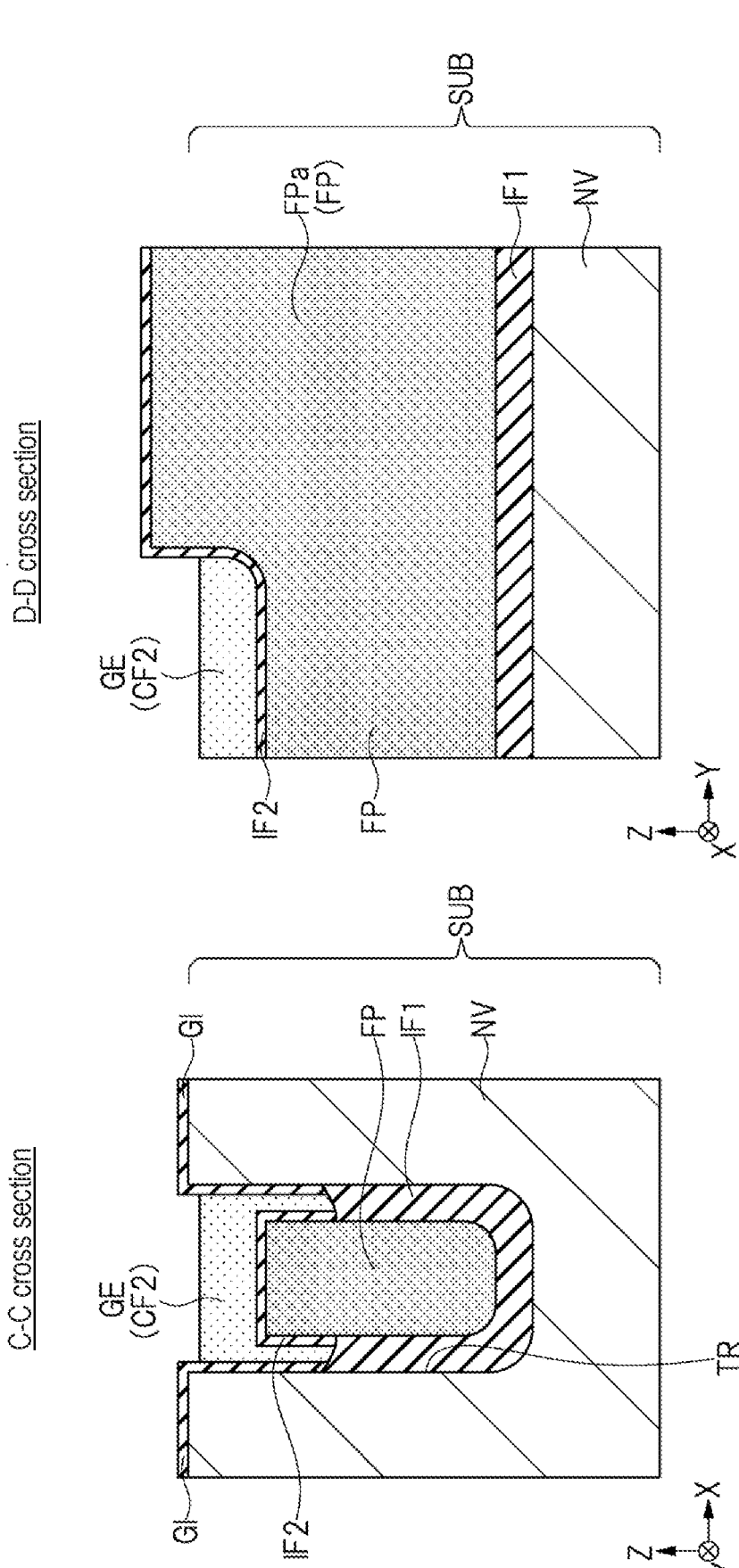
FIG. 14 is a cross-sectional view showing a manufacturing process of the same timing as in FIG. 13.

As shown in FIGS. 13 and 14, an anisotropic dry etching process is performed on the conductive film CF2 to remove a portion of the conductive film CF2 formed outside the trench TR, and to form the gate-electrode GE inside the trench TR (see A-A cross section, C-C cross section, and D-D cross section). By this anisotropic dry etching process, the conductive film CF2 is processed into a sidewall shape as a connecting portion GEa inside the trench TR in which the contact portion FPa is formed, and the connecting portion GEa is formed on both side surfaces of the contact portion FPa via the insulating film IF2 as a part of the gate-electrode GE (see B-B cross section).

In order to completely remove the conductive film CF2 outside the trench TR, the anisotropic dry etching process is performed by over-etching, so that the position of the upper surface of the gate-electrode GE is slightly lower than the position of the upper surface of the semiconductor-substrate SUB (see A-A cross section, C-C cross section, and D-D cross section).

Figure 15:
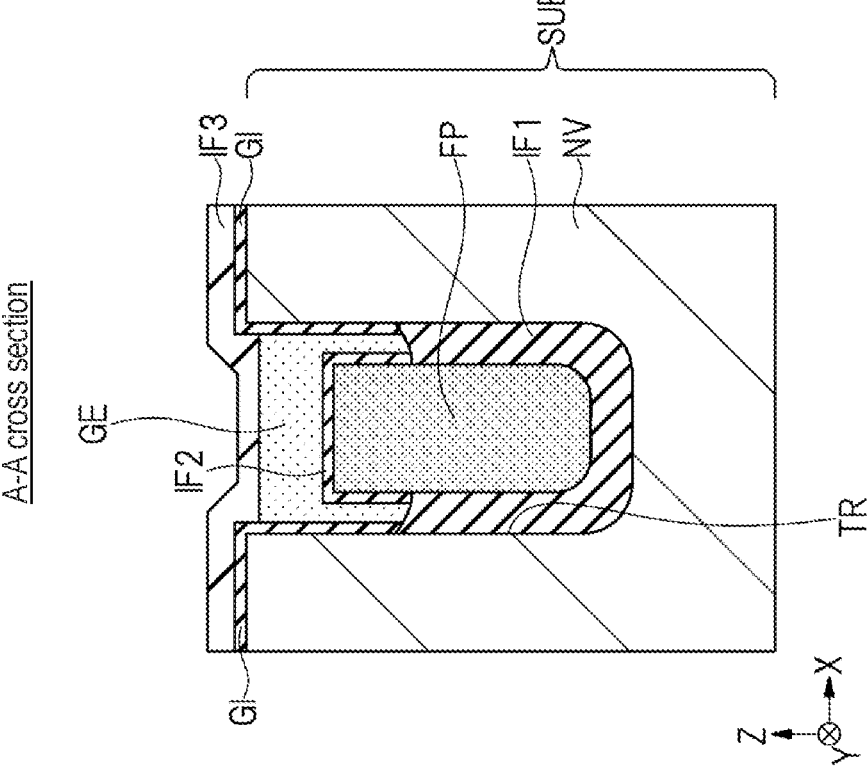
FIG. 15 is a cross-sectional view showing a manufacturing process following FIG. 13.

As shown in FIG. 15, an insulating film IF3 is formed on the upper surface of the semiconductor-substrate SUB by, for example, a CVD method so as to cover the trench TR. The insulating film IF3 is formed of, for example, a silicon oxide film or a silicon nitride film.

Figure 16:
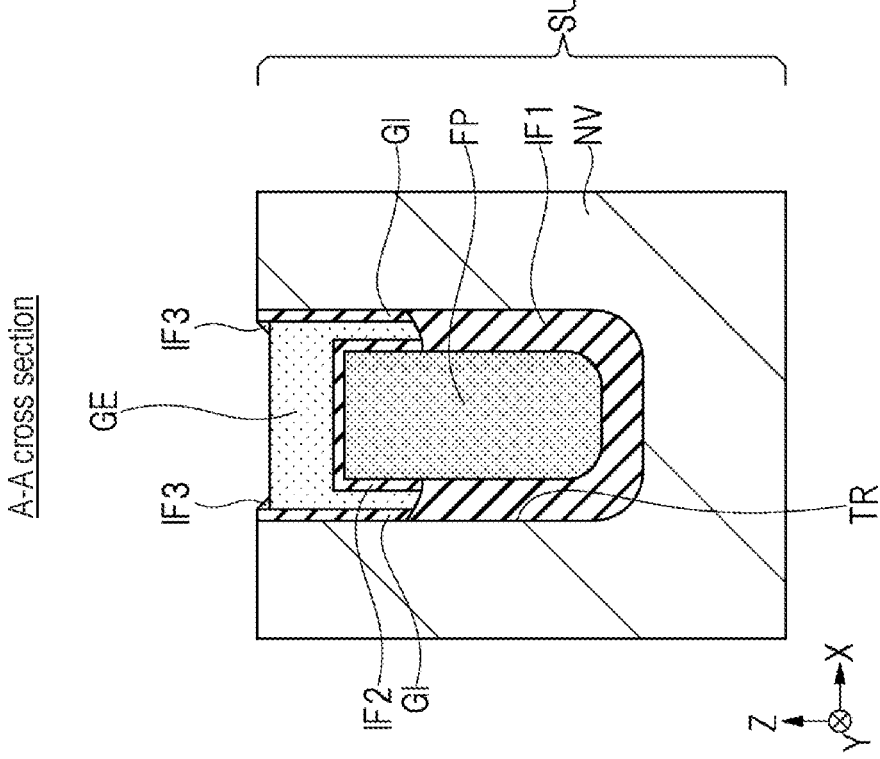
FIG. 16 is a cross-sectional view showing a manufacturing process following FIG. 15.

As shown in FIG. 16, the insulating film IF3 is subjected to an anisotropic dry etching process. As a result, the insulating film IF3 is left on a part of the upper surface of the gate electrode GE so as to be in contact with the gate insulating film GI (see A-A cross section), and the connecting portion GEa is covered with the insulating film IF3 (see B-B cross section).

Figure 17:
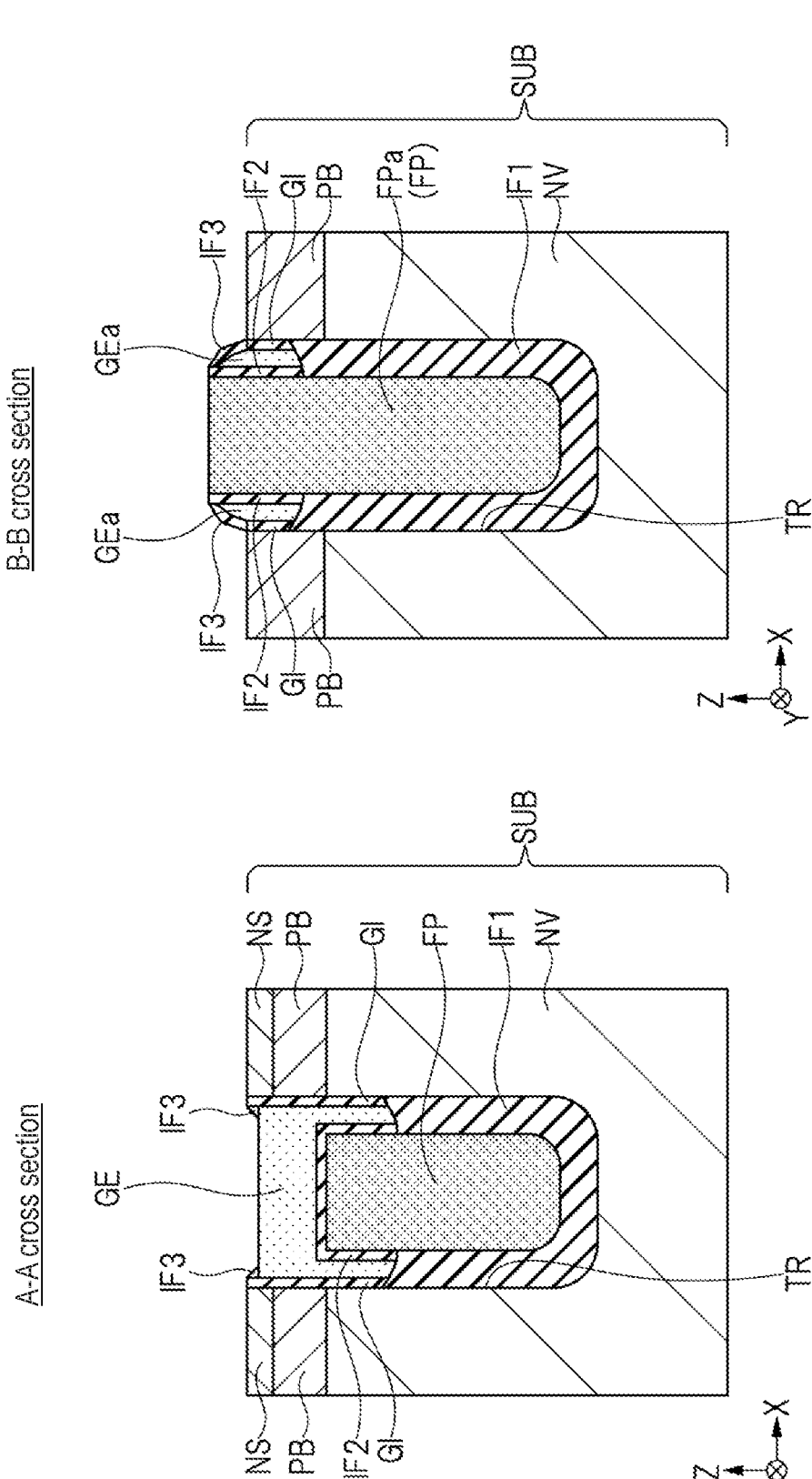
FIG. 17 is a cross-sectional view showing a manufacturing process following FIG. 16.

As shown in FIG. 17, first, a p-type body area PB is formed in the semiconductor substrate SUB by introducing, for example, boron (B) by an ion implantation method on the upper surface of the semiconductor substrate SUB. The body region PB is formed to be shallower than the trench TR. Next, the periphery of the contact portion FPa is covered with a resist pattern, and then, for example, arsenic (As) is introduced by an ion implantation method to form an n-type source region NS in the body region PB. Next, the resist pattern is removed by asking process. Thereafter, the semiconductor substrate SUB is subjected to a heat treatment to diffuse impurities contained in the source-region NS and the body-region PB.

Note that a thin silicon oxide film may be formed as a through film on the semiconductor-substrate SUB prior to the ion implantation of the source region NS and the body region PB. The through film may be removed after the ion-implantation, or may be left as a part of the interlayer insulating film IL.

Figure 18:
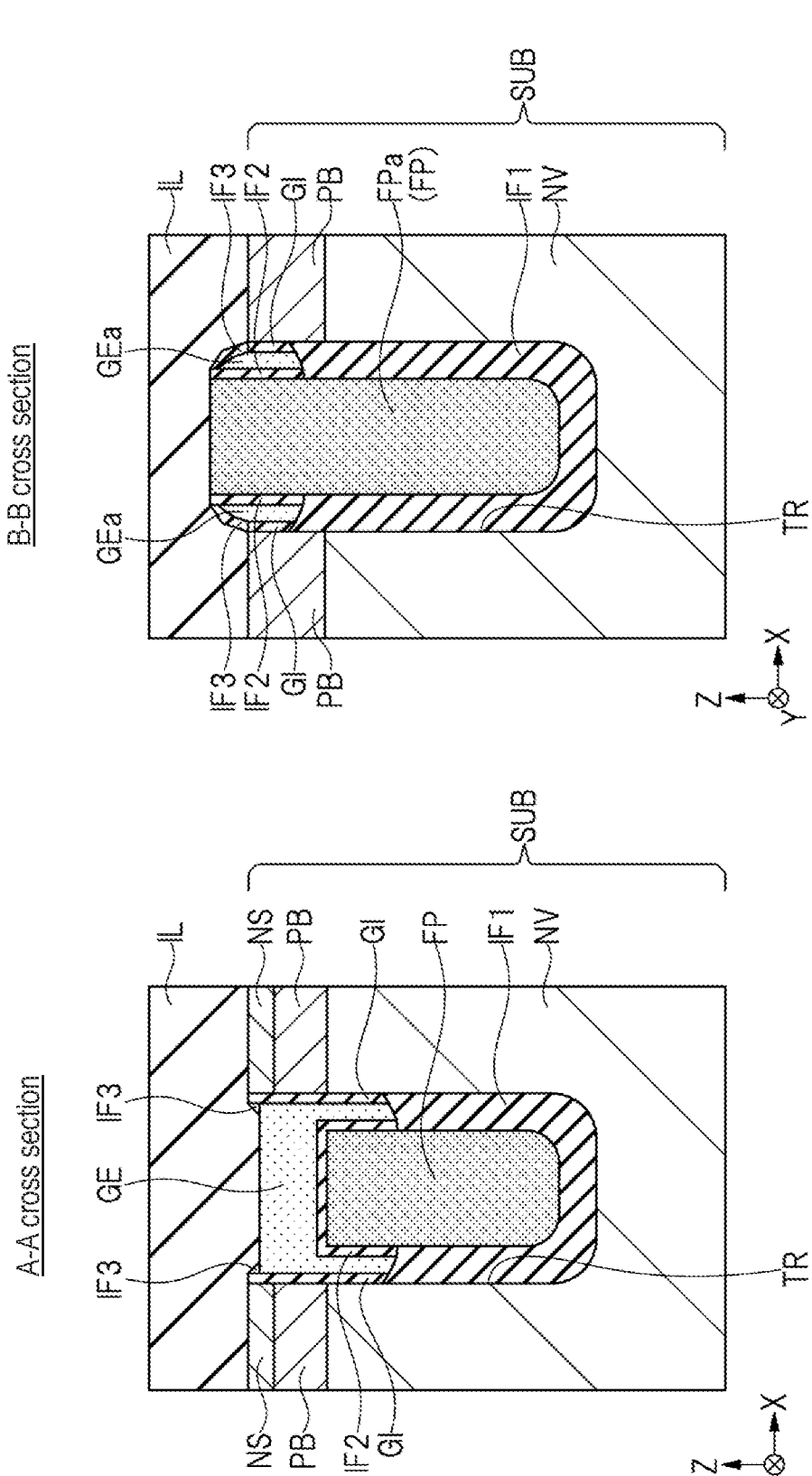
FIG. 18 is a cross-sectional view showing a manufacturing process following FIG. 17.

As shown in FIG. 18, an interlayer insulating film IL is formed on the upper surface of the semiconductor substrate SUB by, for example, a CVD method so as to cover the trench TR. The interlayer dielectric film IL is formed of, for example, a silicon oxide film. The interlayer insulating film IL may be a laminated film of a thin silicon oxide film formed by a CVD method and a PSG film formed by a coating method.

Figure 19:
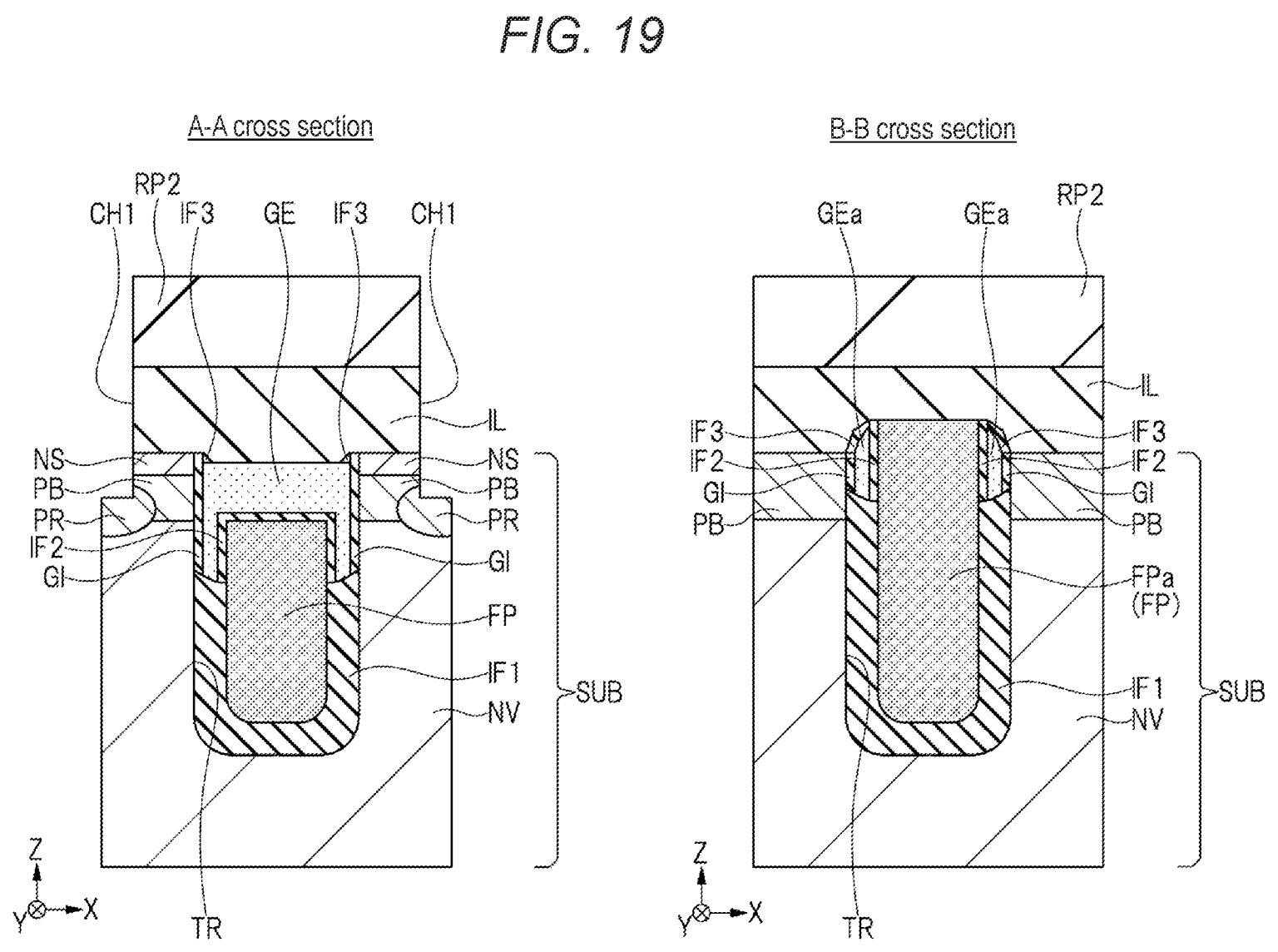
Figure 20:
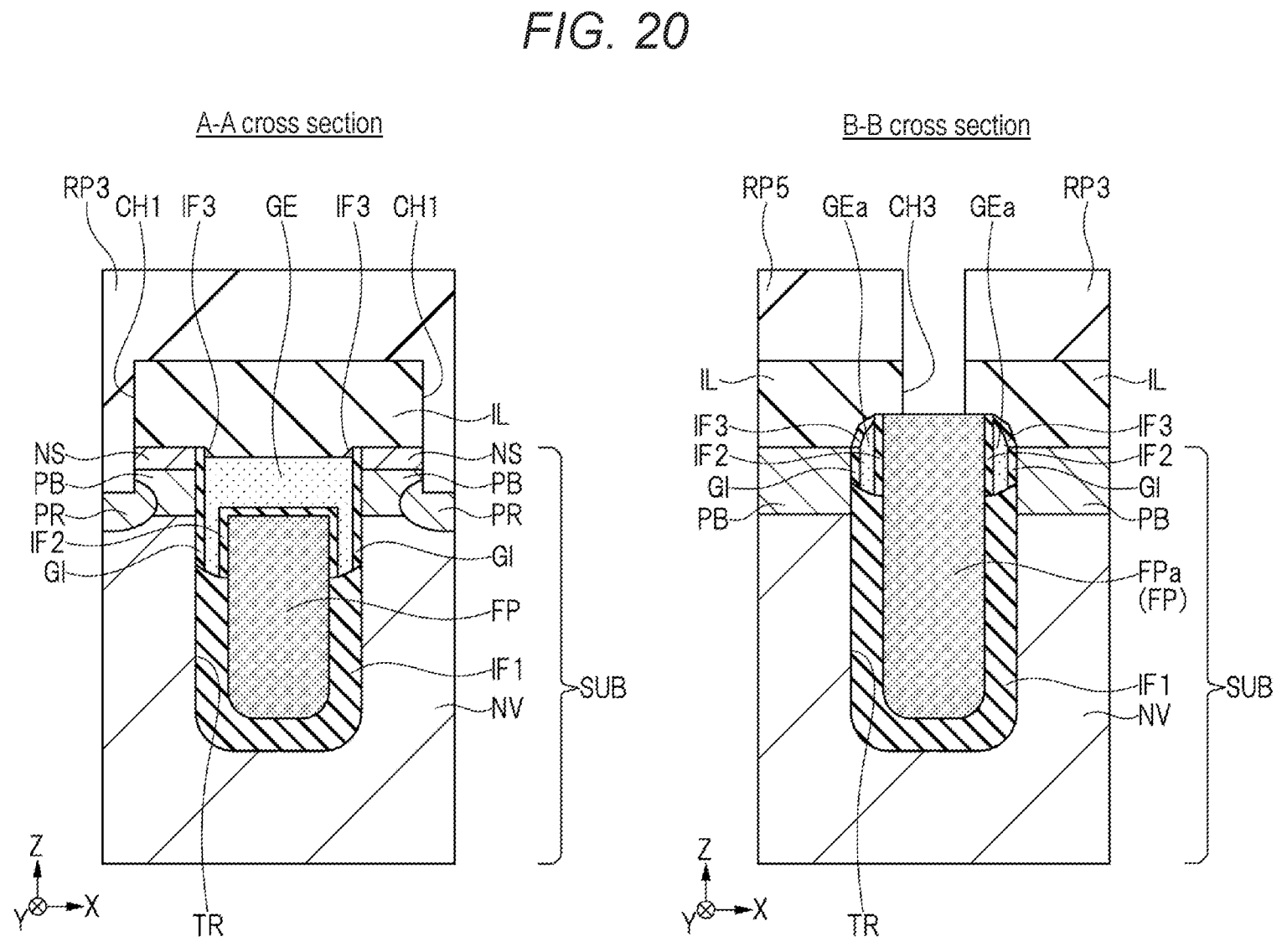

As shown in FIGS. 19 and 20, a hole CH1, a hole CH2, and a hole CH3 are formed in the interlayer insulating film IL. Although the hole CH2 is not shown here, the hole CH2 is formed in the same step as the step of forming the hole CH3.

First, as shown in FIG. 19, a resist pattern RP2 having a pattern for opening the semiconductor substrate SUB on which the source regions NS are formed is formed on the interlayer insulating film IL. Next, a dry etching process is performed using the resist pattern RP2 as a mask to form the holes CH1 in the interlayer insulating film IL, in the source region NS, and in the body region PB respectively. The bottom of each of the holes CH1 are located in the body area PB.

Next, a p-type high concentration region PR is formed in the body region PB at the bottom of the hole CH1 by introducing, for example, boron (B) into the body region PB by the ion-implantation method. Thereafter, the resist pattern RP2 is removed by an ashing process.

Next, as shown in FIG. 20, on the interlayer insulating film IL, a resist pattern RP3 is formed. The resist pattern RP3 has a pattern that opens on the contact portion FPa, on a first end portion of the gate electrode GE on the region 2A side, and on a second end portion of the gate electrode GE on the region 2A' side. Next, a dry etching process is performed using the resist pattern RP3 as a mask to form a hole CH3 and a hole CH2 in the interlayer insulating film IL. The hole CH3 is formed so as to overlap the contact portion FPa in a plan view. The hole CH2 is formed so as to overlap the first end portion and the second end portion in a plan view. Thereafter, the resist pattern RP3 is removed by ashing process.

Note that either the step of forming the hole CH1 or the step of forming the hole CH2 and the hole CH3 may be performed first.

Figure 21:
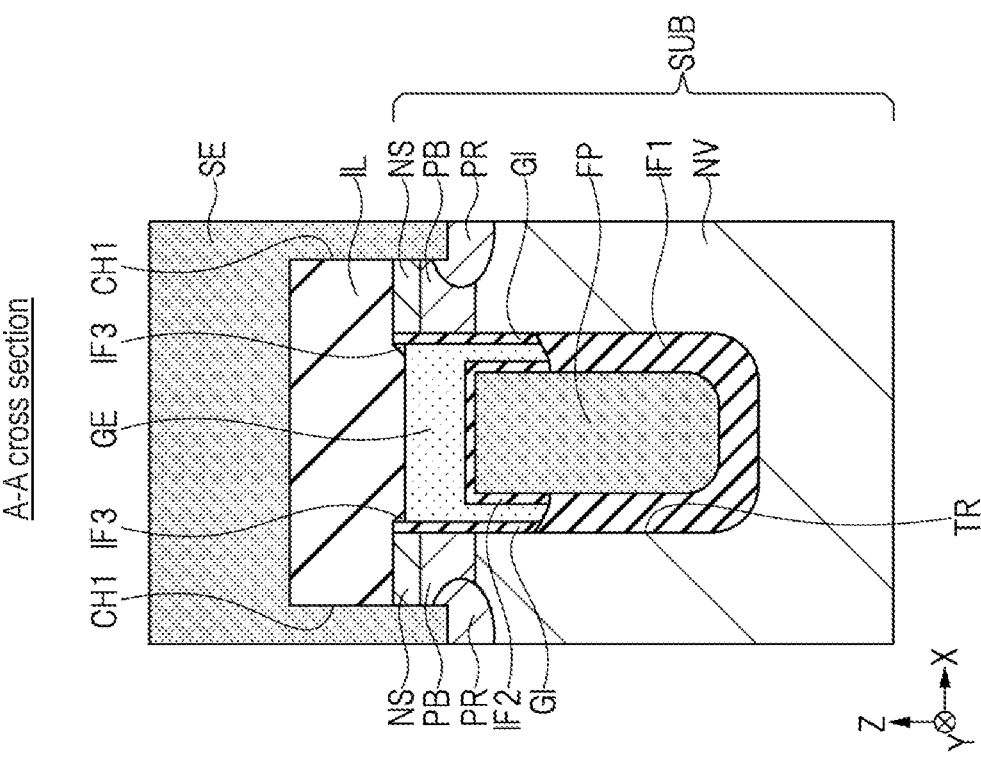
FIG. 21 is a cross-sectional view showing a manufacturing process following FIG. 20.

Next, as shown in FIG. 21, the source electrode SE and the gate wiring GW are formed on the interlayer insulating film IL. First, a stacked film of a barrier metal film made of, for example, a titanium nitride film and a conductive film made of, for example, an aluminum film is formed on the interlayer insulating film IL by a sputtering method or a CVD method. Next, the stacked film is patterned to form the source electrode SE and the gate wiring GW.

The gate wiring GW is embedded in the hole CH2 and electrically connected to the gate electrode GE. The source electrode SE is embedded in the hole CH1 and the hole CH3, and is electrically connected to the source region NS, the body region PB, the high concentration region PR, and the field plate electrode FP.

Next, although not shown here, a protective film made of, for example, a polyimide film is formed on the source electrode SE and the gate wiring GW by, for example, a coating method. By opening parts of the protective film, regions of the source electrode SE and the gate wire GW that become a source pad SP and a gate pad GP are exposed.

Thereafter, the semiconductor device 100 shown in FIGS. 4 and 5 is manufactured through the following steps. First, the lower surface of the semiconductor substrate SUB is polished as needed. Next, an n-type drain region ND is formed by introducing arsenic (As) or the like into the lower surface of the semiconductor substrate SUB by ion-implantation. Next, a drain electrode DE is formed on the lower surface of the semiconductor substrate SUB by sputtering.

Although the present invention has been described in detail based on the above-described embodiments, the present invention is not limited to the above-described embodiments, and can be variously modified without departing from the gist thereof.

For example, in the above-described embodiment, a MOSFET of the trench gate structure is exemplified as a semiconductor element included in the semiconductor device 100, but the semiconductor element may be a IGBT. Then, the n-type source region NS functions as an emitter region, the source electrode SE functions as an emitter electrode, the p-type body region PB functions as a base region, the n-type drain region ND functions as a collector region, and the drain electrode DE functions as a collector electrode.

What is claimed is:
1. A semiconductor device comprising:
a semiconductor substrate of a first conductivity type having an upper surface and a lower surface;

a trench formed in the semiconductor substrate so as to reach a predetermined depth from the upper surface of the semiconductor substrate and extending to a first direction in a plan view;

a field plate electrode formed at a lower portion inside the trench;

a gate electrode formed in an upper portion inside the trench and being electrically isolated from the field plate electrode inside the trench;

an interlayer insulating film formed on the upper surface of the semiconductor substrate;

a source electrode formed on the interlayer insulating film so as to cover the trench;

a gate wiring formed on the interlayer insulating film so as to surround the source electrode in a plan view; and a first hole, a second hole and a third hole each formed in the interlayer insulating film, wherein the gate electrode includes a first end portion and a second end portion located on an opposite side of the first end portion in the first direction in a plane view, wherein the field plate electrode further includes a contact portion at the upper portion inside the trench which is located between the first end portion and the second end portion of the gate electrode in a plan view, wherein the first hole is formed so as to overlap the first end portion of the gate electrode in a plan view, wherein the second hole is formed so as to overlap the second end portion of the gate electrode in a plan view, wherein the third hole is formed so as to overlap the contact portion of the field plate electrode in a plan view, wherein the gate wiring is embedded in the first hole and the second hole and is electrically connected to the gate electrode, wherein the source electrode is embedded in the third hole and electrically connected to the field plate electrode, and wherein the gate electrode further includes a connecting portion electrically connecting the first end portion and the second end portion in the trench in which the contact portion of the field plate electrode is formed.

2. A semiconductor device according to claim 1, wherein the contact portion of the field plate electrode and the connecting portion of the gate electrode extend in the first direction respectively, and wherein the connecting portion of the gate electrode is formed on a side surface of the contact portion of the field plate electrode via an insulating film in a second direction intersecting the first direction in a plan view.

3. A semiconductor device according to claim 1, wherein the gate electrode and the connection portion are formed of an integrated polycrystalline silicon film.

4. A semiconductor device according to claim 1, further comprising:

a body region formed on the upper surface of the semiconductor substrate and having a second conductivity type opposite to the first conductivity type so as to be shallower than the trench;

a source region of the first conductivity type formed in the body region;

a drain electrode formed on the lower surface of the semiconductor substrate; and a fourth hole formed in the interlayer insulating film, the source region and in the body region, wherein the source electrode is embedded in the fourth hole and is electrically connected to the source region and the body region.

5. A semiconductor device according to claim 1, wherein the gate wiring is in direct contact with at least one of the first end portion and the second end portion.

* * * * *